(12) United States Patent
Yamazaki et al.

(10) Patent No.: US 6,750,618 B2
(45) Date of Patent: Jun. 15, 2004

(54) LIGHT EMITTING DEVICE AND A METHOD OF MANUFACTURING THE SAME

(75) Inventors: Shunpei Yamazaki, Kanagawa (JP); Masaaki Hiroki, Kanagawa (JP); Takeshi Fukunaga, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/408,217

(22) Filed: Apr. 8, 2003

(65) Prior Publication Data

US 2003/0214247 A1 Nov. 20, 2003

Related U.S. Application Data

(62) Division of application No. 10/175,887, filed on Jun. 21, 2002, now Pat. No. 6,555,968, which is a division of application No. 09/817,674, filed on Mar. 27, 2001, now Pat. No. 6,420,834.

(30) Foreign Application Priority Data

Mar. 27, 2000 (JP) ...................... 2000-085910

(51) Int. Cl.[7] .............................................. G09G 3/10
(52) U.S. Cl. ................... 315/169.3; 438/780; 438/758; 257/347; 257/517
(58) Field of Search .......................... 315/169.3, 169.1; 438/758, 762, 780, 782; 257/347, 517, 349, 479; 313/483; 349/69; 345/45, 83

(56) References Cited

U.S. PATENT DOCUMENTS

| | | | |
|---|---|---|---|
| 5,153,483 A | 10/1992 | Kishino et al. | .......... 315/169.1 |
| 6,023,308 A | 2/2000 | Takemura | ..................... 349/42 |
| 6,057,647 A | 5/2000 | Kurosawa et al. | .......... 313/257 |
| 6,175,345 B1 | 1/2001 | Kuribayashi et al. | ........ 257/448 |
| 6,277,679 B1 | 8/2001 | Ohtani | ........................ 438/151 |
| 6,281,552 B1 | 8/2001 | Kawasaki et al. | .......... 257/344 |
| 6,303,963 B1 | 10/2001 | Ohtani et al. | ................ 257/350 |
| 6,380,558 B1 * | 4/2002 | Yamazaki et al. | ............. 257/57 |
| 6,399,988 B1 | 6/2002 | Yamazaki | .................... 257/344 |
| 6,469,317 B1 | 10/2002 | Yamazaki et al. | ............ 257/59 |
| 6,618,029 B1 * | 9/2003 | Ozawa | ........................ 345/82 |

FOREIGN PATENT DOCUMENTS

JP      05-107561      4/1993

OTHER PUBLICATIONS

Baldo et al.; "Highly Efficient Phosphorescent Emission from Organic Electroluminescent Devices"; *Nature*, vol. 395; pp. 151–154; Sep. 10, 1998.

Baldo et al.; "Very High–Efficiency Green Organic Light–Emitting Devices Based on Electrophorescence"; *Applied Physics Letters*, vol. 75, No. 1; pp. 4–6; Jul. 5, 1999.

Tsutui et al.; "Electroluminescence in Organic Thin Films"; *Photochemical Processes in Organized Molecular Systems*, pp. 437–450; 1991.

Tsutsui et al.; "High Quantum Efficiency in Organic Light–Emitting Devices with Iridium–Complex as a Triplet Emissive Center"; *Japanese Journal of Applied Physics*, vol. 38, Part 12B; pp. L1502–L1504; Dec. 15, 1999.

* cited by examiner

*Primary Examiner*—Haissa Philogene
(74) *Attorney, Agent, or Firm*—Fish & Richardson P.C.

(57) ABSTRACT

To provide a light emitting device having a highly definite pixel portion. An anode (102) and a bank (104) orthogonal to the anode (102) are formed on an insulator (101). A portion of the bank (104) (controlling bank 104b) is made of a metal film. By applying a voltage thereto, an electric field is formed, and a track of an EL material that is charged with an electric charge can be controlled. Thus, it becomes possible to control a film deposition position of an EL layer with precision by utilizing the above method.

39 Claims, 19 Drawing Sheets crystallizing step introducing n-type impurity laser annealing step

LIGHT EMITTING DEVICE AND A METHOD OF MANUFACTURING THE SAME

CROSS-REFERENCE TO RELATED APPLICATIONS

This application is a divisional of U.S. Ser. No. 10/175,887, filed Jun. 21, 2002, now U.S. Pat. No. 6,555,968 now allowed, which is a divisional of U.S. Ser. No. 09/817,674, filed Mar. 27, 2001, now U.S. Pat. No. 6,420,834, which issued on Mar. 27, 2001 both of which are incorporated by reference.

BACKGROUND OF THE INVENTION

1. Field of the Invention

The present invention relates to a device having an element that is comprised of a luminous material sandwiched between electrodes (hereinafter referred to as luminous element) (hereinafter the device will be referred to as light emitting device) and to a method of manufacturing the same. In particular, the present invention relates to a light emitting device using a luminous element that utilizes a luminous material (hereinafter referred to as an EL material) which provides EL (Electro Luminescence) (hereinafter the luminous element will be referred to as an EL element and the device will be referred to as an EL light emitting device). It is to be noted that an organic EL display and an organic light emitting diode (OLED) are included in the light emitting device of the present invention.

Further, the EL materials that can be used in the present invention include all the EL materials that luminesce by way of a singlet excitation or a triplet excitation, or via both excitations (fluorescence and/or phosphorescence).

2. Description of the Related Art

The EL light emitting device is constructed of a structure having an EL element that is composed of an anode, a cathode, and an EL material sandwiched therebetween. By applying a voltage between the anode and the cathode to cause a current to flow in the EL material, the carriers are made to re-couple, whereby the EL element emits light. In other words, the luminous element itself in the EL light emitting device has a luminescing ability, and therefore the EL light emitting device, unlike a liquid crystal display device, does not need a back light. In addition, the EL light emitting device has merits such as a wide angle of view and is light in weight.

At this point, when film deposition is performed on the EL material to thereby form the EL layer, various types of film deposition methods are adopted. In particular, the evaporation method is employed for the film deposition of a low molecular weight type organic EL material, while the spin coating method or the ink jet method is employed for film deposition of a high molecular weight type organic EL material.

In any case, although there are strong points and shortcomings in all the film deposition methods, there exist a problem in the case of the evaporation method where the utilization of EL material is inefficient. In the case of the evaporation method, the EL material is formed by being vaporized through resist heating or electron beam heating and then scattered. However, the amount of loss due to the EL material being formed on areas other than on the surface to be formed, such as on an evaporation mask (shadow mask) and on the interior of the evaporation chamber, was large. The price of the EL material in the present situation is high, and hence, this type of problem consequently invites an increase in the manufacturing costs.

Further, in the case of the ink jet method, the tracks of the drops of solution containing the EL material that is discharged from the tip end of a nozzle is difficult to control, thereby making it difficult to accurately control the point where the drops of solution is to be applied (the portion where the EL layer is to be formed). If the application point is off the point, a problem in which the drops of solution will mix into an adjacent pixel may occur. This problem, in particular, becomes particularly a conspicuous problem in terms of manufacturing a light emitting device having a highly definite pixel portion.

SUMMARY OF THE INVENTION

The present invention has been made in view of the above problem, and therefore an object of the present invention is to provide a technique for accurately controlling a film deposition position in forming an EL material. Another object of the present invention is to attain a light emitting device that has a highly definite pixel portion. A further object of the present invention is to provide an electric appliance, which has high displaying quality, that employs the light emitting device as its display portion.

The present invention is characterized in that a metal film is used for forming a portion of a bank for dividing the pixels, and then a voltage is applied to the metal film (to make a negative or positive charge) to form an electric field to thereby control a track of the EL material. Therefore, in this specification, "applying an electric field" means "controlling the direction of the charged particles".

It is to be noted that the term "bank" throughout this specification, indicates a lamination layer that is composed of an insulating film and a conductive film and provided so as to surround a pixel electrode. The bank assumes the role of dividing the respective pixels. In addition, for the sake of convenience in making the present invention clear, the bank is divided into parts and classified as "a supporting bank" and "a controlling bank" throughout this specification.

By adopting the above-mentioned structure, in film deposition methods such as the evaporation method, the ion plating method, or the ink jet method in which the discharged EL material adheres to the upper part or the lower part of the surface on which the EL material is to be formed, it is possible to accurately control the film deposition position of the EL material. As a result, a light emitting device having a highly definite pixel portion can be attained.

BRIEF DESCRIPTION OF THE DRAWINGS

The above and other objects and features of the present invention will be more apparent from the following description taken in conjunction with the accompanying drawings.

DETAILED DESCRIPTION OF THE PREFERRED EMBODIMENTS

Figure 1A:
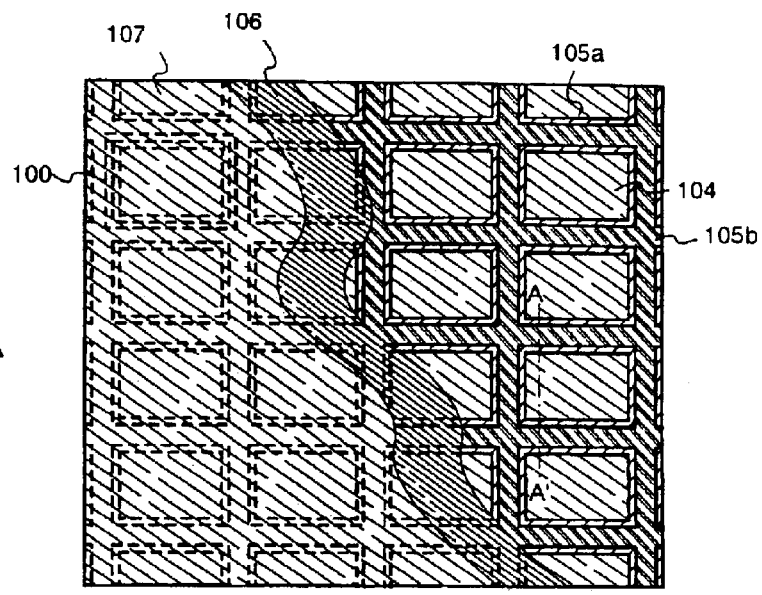
FIGS. 1A and 1B are diagrams showing a top view structure and a cross-sectional structure, respectively, of a light emitting device.
Figure 1B:
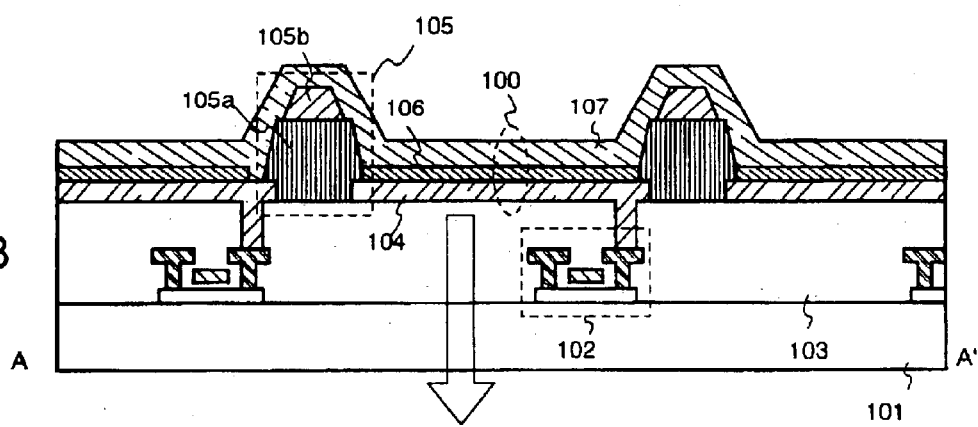

A structure of the light emitting device of the present invention will be explained with reference to FIGS. 1A and 1B. The top view of a pixel portion of the light emitting device is shown in FIG. 1A, and the cross-sectional view thereof taken along the line A–A' of FIG. 1A is shown in FIG. 1B. However, the state of the light emitting device shown here is before the sealing of a luminous element.

In the light emitting device of the present invention, a TFT 102 is provided on an insulator 101. A glass substrate, a plastic substrate (including a plastic film), a metal substrate, and a ceramic substrate having an insulating film thereon may be used as the insulator 101, or a quartz substrate may be used as it is.

A know structure of an n-channel TFT or a p-channel TFT may be used to form the TFT (thin film transistor) 102. The structure thereof may be a top gate structure (typically a planar type TFT) or a bottom gate structure (typically an inverted stagger type TFT). Further, although there is also no limit placed on the arrangement of the TFT, typically a pixel structure disclosed in Japanese Patent Application Laid-open No. Hei 5-107561 by the present applicant may be adopted. Covered by an interlayer insulating film 103, the TFT 102 is electrically connected to a pixel electrode 104 with the interlayer insulating film 103 sandwiched therebetween. An insulating film containing silicon, typically a silicon oxide film, a silicon nitride film, a silicon oxynitride film, or a carbonized silicon film can be used as the interlayer insulating film 103. Further, a resin film can be used, or the insulating film containing the resin film and the silicon may be combined and used.

A conductive film having a large work function is used as the pixel electrode 104 in the embodiment mode, typically, a transparent oxide conductive film with respect to visible radiation is used. As the oxide conductive film, a conductive film made from indium oxide, tin oxide, zinc oxide, or a compound composed of these materials can be used. In addition, a film in which gallium is doped into these oxide conductive films may be used. A bank 105 is further provided surrounding the pixel electrode 104. The bank 105 is composed of a supporting bank 105a that is made of an insulating film, and a controlling bank 105b that is made of a metal film formed thereon. At this point, the line width of the controlling bank 105b is formed thinner than that of the supporting bank 105a. It is preferable that the supporting bank 105a and the controlling bank 105b have taper shapes. In the present invention, even if a voltage having a polarity that is different from the pixel electrode is applied to the controlling bank 105b, the controlling bank 105b is charged with a negative or a positive charge, thereby making it possible to control the trajectory of the EL material by applying an electric field thereto.

An EL layer 106 is further provided in the pixel that is surrounded by the bank 105, and a cathode 107 is provided so as to cover the bank 105 and the EL layer 106.

It is to be noted that in this specification, the EL layer denotes an insulating layer that is formed between an anode and a cathode in an EL element. The layer thereof is formed from the combination of various kinds of organic films or inorganic films. Typically, the EL layer includes at least a light emitting layer, and an EL layer in which an electron injection layer and an electron transporting layer are combined with the light emitting layer is used. Further, an organic EL material, an inorganic EL material, or an EL material that is composed of a combination thereof is used as the EL layer 106. In the case of using an organic EL material, it is appropriate to use a low molecular weight type material, a high molecular weight type material, or any known material.

A conductive film having a small work function is used to form the cathode 107. Typically, a conductive film containing an element that belongs to Group 1 or Group 2 of the Periodic Table is used. An alloy film containing magnesium, lithium, cesium, beryllium, potassium, or calcium is typically used. In addition, a bismuth film can also be used as the conductive film to form the cathode 107.

Thus, the above pixel electrode (anode) 104, the EL layer 106 and the cathode 107 forms an EL element 100. Actually, either a resin film as a sealing material is formed on the EL element 100 or an airtight space is formed on top of the EL element 100 to thereby protect the EL element 100 from the open air. These measures are taken for the purpose of preventing, as much as possible, contact with oxygen and moisture which causes the EL layer 106 and the cathode 107 to oxidize thereby resulting in deterioration of the EL element.

The light emitting device of the present invention adopting a structure such as the one above is characterized in that in the case of using methods such as the evaporation method, the ion plating method, or the ink jet method in which the EL material is film deposited by being discharged from an upper direction or a lower direction and adhering to a surface, an electric field is applied to the EL material by using the metal film that forms a portion of the bank, whereby the film deposition position thereof is controlled by this electric field.

By implementing the present invention, it becomes possible to form the EL material while making a precise position control. Consequently, the realization of the light emitting device having a highly definite pixel portion can be realized.

[Embodiment 1]

Figure 2:
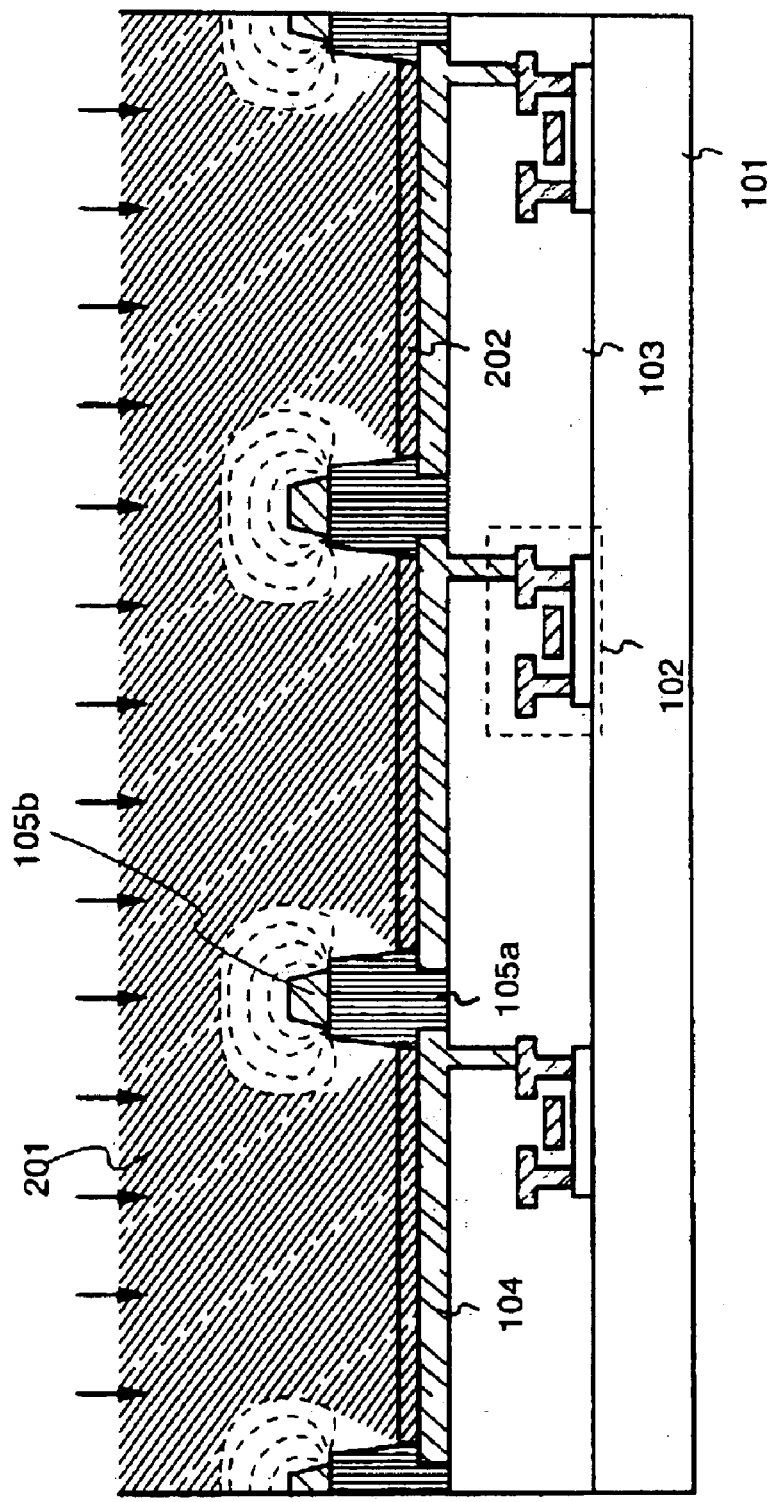
FIG. 2 is a diagram for explaining a film deposition process of an EL material.

A film deposition process of an EL layer in manufacturing a light emitting device having the structure shown in FIGS. 1A and 1B is explained with reference to FIG. 2. Note that reference symbols of FIGS. 1A and 1B will be referred to in the explanation of a portion thereof. In FIG. 2, the TFT 102 is formed on the insulator 101, and the pixel electrode (functions as an anode in Embodiment 1) 104 is formed on the interlayer insulating film 103, which is formed covering the TFT 102. In addition, the bank 105 that is composed of the supporting bank 105a and the controlling bank 105b is formed so as to surround the pixel electrode 104.

Then in this state the pixel electrode 104 is first charged with a positive charge. A positive voltage may be applied to the pixel electrode 104, or it is possible to charge the pixel electrode by subjecting it to an ion shower that has been positively charged. In the case of applying a positive voltage, the TFT 102 may be operated to thereby apply the positive voltage. Next, the controlling bank 105b is charged with a negative charge. It is also possible to apply a negative voltage to the controlling bank 105b. The size of the negative voltage may be appropriately determined by the implementor.

Under this condition, an EL material (a solution containing an EL material is also included as an EL material in this specification) 201 is laminated by using the evaporation method, the ion plating method, or the ink jet method. At this point, the present invention is characterized in that the EL material 201 is charged so that it has the same polarity as that of the controlling bank 105b. In other words, in the case of Embodiment 1, because the controlling bank 105b is charged with a negative charge, the EL material 201 is also charged with a negative charge. Thus, the EL material 201 repels the electric field that is formed in the periphery of the controlling bank 105b, thereby drawing a track which avoids the controlling bank 105b.

In addition, because the pixel electrode 104 is charged with a positive charge in Embodiment 1, it moves in a direction that draws the negatively charged EL material 201 thereto.

Avoiding the controlling bank 105b, the EL material 201 is thus laminated on the pixel electrode 104. Accordingly, an EL layer 202 is formed on a portion of the pixel. That is, without particularly using such as a shadow mask, the EL material can be intensively formed on the pixel, thereby making it possible to drastically improve the utilization efficiency of the EL material.

Further, the present invention may be implemented in a highly definite pixel portion, such as a pixel portion having a pixel pitch of several tens of μm, without any problems. In the method of using a shadow mask to laminate the EL material, the alignment precision of the shadow mask becomes a problem, and hence is not a suitable method for the formation of a highly definite pixel portion. In such a case, it can be stated that the implementation of the present invention is extremely effective.

[Embodiment 2]

A case of implementing the present invention when film depositing the EL material by the evaporation method will be explained in Embodiment 2 with reference to FIG. 3.

Figure 3:
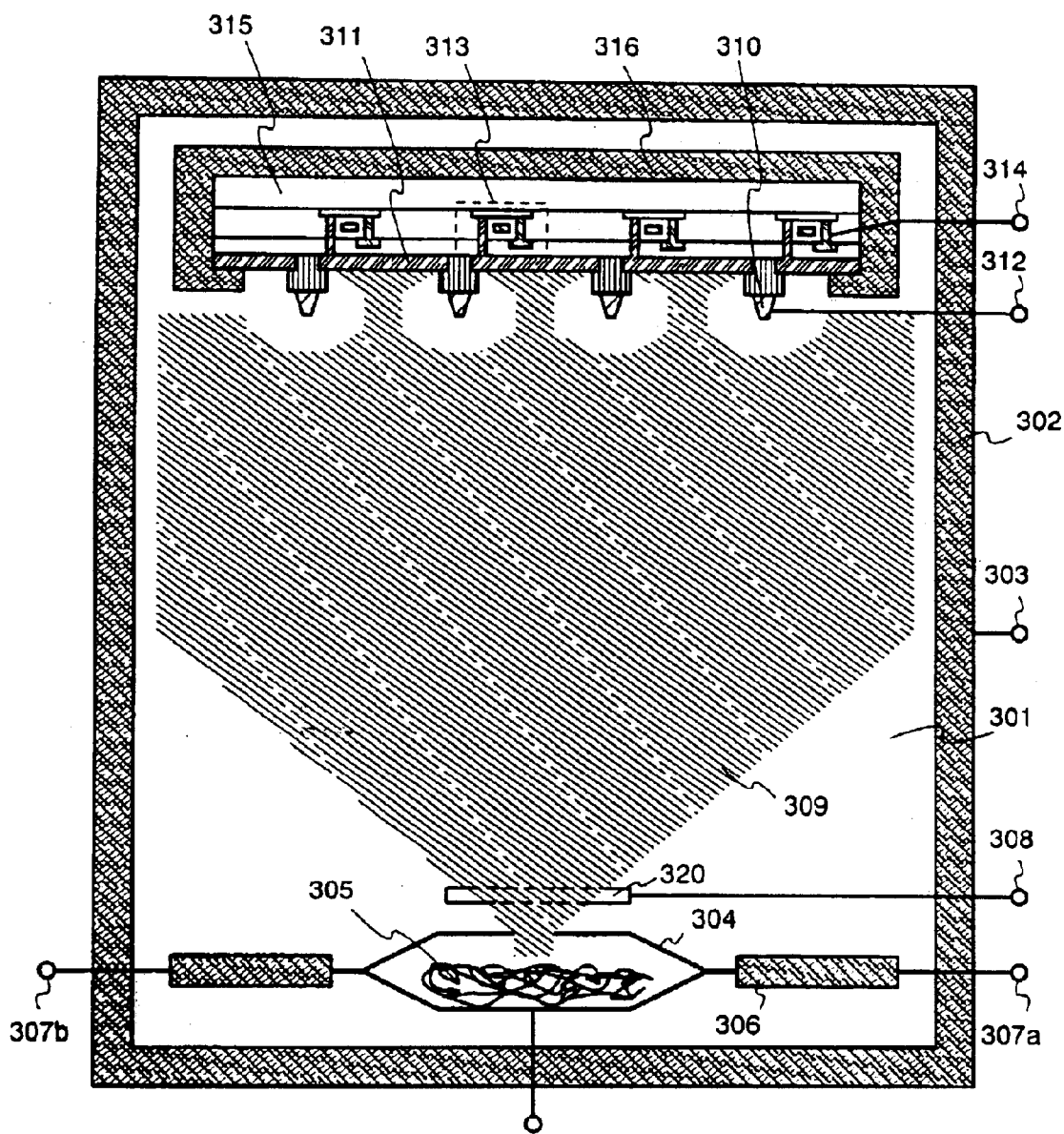
FIG. 3 is a diagram for explaining a film deposition process of an EL material by using the evaporation method.

In FIG. 3, reference symbol 301 denotes an evaporation chamber, and a bulkhead 302 of the evaporation chamber is connected to a negative power source 303 that will be charged with a negative voltage. An evaporation boat 304 is provided inside the evaporation chamber 301, and a solid state EL material 305 is provided inside the evaporation boat 304. The evaporation boat 304 is heated by using power sources 307a and 307b, which are connected to a supporting platform 306. That is, Embodiment 2 uses an evaporation source by resist heating. Right outside a hole that is provided in the evaporation boat 304 (a hole for the EL material that has turned into a gaseous body to exit to the outside of the evaporation boat), a ring-like electrode 320 is provided so as to surround the EL material which has turned into a gaseous body (hereinafter referred to as a gaseous EL material) coming out from the hole. The ring-like electrode 320 is connected to a negative power source 308. An electric field is formed in the interior of the ring-like electrode 320 to thereby charge the gaseous EL material with a negative charge. In other words, the gaseous EL material spurting from the evaporation boat 304 is made to pass through the electric field while it is scattering to thereby apply an electric charge. At this point, because the bulkhead 302 of the evaporation chamber is charged with a negative charge, the EL material that will adhere to the bulkhead 302 can be suppressed to a minimum.

Avoiding the electric fields formed by controlling banks 310, the scattered gaseous EL material 309 is thus laminated on a pixel electrode 311. A negative power source 312 is connected to the controlling banks 310 to thereby form the electric field. It is to be noted that all the controlling banks not shown in the drawing are electrically connected so that they all have an equivalent electric potential.

Further, at this point, a positive power source 314 is connected to a source wiring of a TFT 313 to which the pixel electrode 311 is connected, so that a positive voltage can be applied to the pixel electrode 311. A substrate 315 having the TFT 313 formed thereon is held by a susceptor 316. The susceptor 316 may be charged with a negative charge during film deposition.

A positive voltage is applied to the pixel electrode 311 by operating the TFT 313, which is electrically connected, to thereby charge it with a positive charge. In other words, Embodiment 2 is characterized in that the EL material is laminated on the pixel electrode under the state of operating the TFT 313. Of course, it is not always necessary that the TFT 313 be operated.

By adopting the above structure, the utilization efficiency of the gaseous EL material 309 that is to be evaporated is enhanced, thereby making it possible to form a desired EL layer with the least essential amount of EL material. Accordingly, the consumption amount of the EL material is substantially reduced, and hence the manufacturing cost can be reduced.

Note that although an example of using a resist heating as the evaporation source was shown here, electron beam (EB) heating may be used.

Further, an example of charging the gaseous EL material with a negative charge was shown in Embodiment 2, but it may be charged with a positive charge. In the case of charging the gaseous EL material with a positive charge, the bulkhead 302, the evaporation boat 304, and the controlling banks 310 may be charged with a positive charge whereas the pixel electrode 311 may be charge with a negative charge.

[Embodiment 3]

A case of implementing the present invention when performing the application of the EL material by using the ink jet method will be explained in Embodiment 3 with reference to FIGS. 4A and 4B. The processes illustrated in FIGS. 4A and 4B are performed under an inert atmosphere (under a nitrogen gas or an inert gas).

Figure 4A:
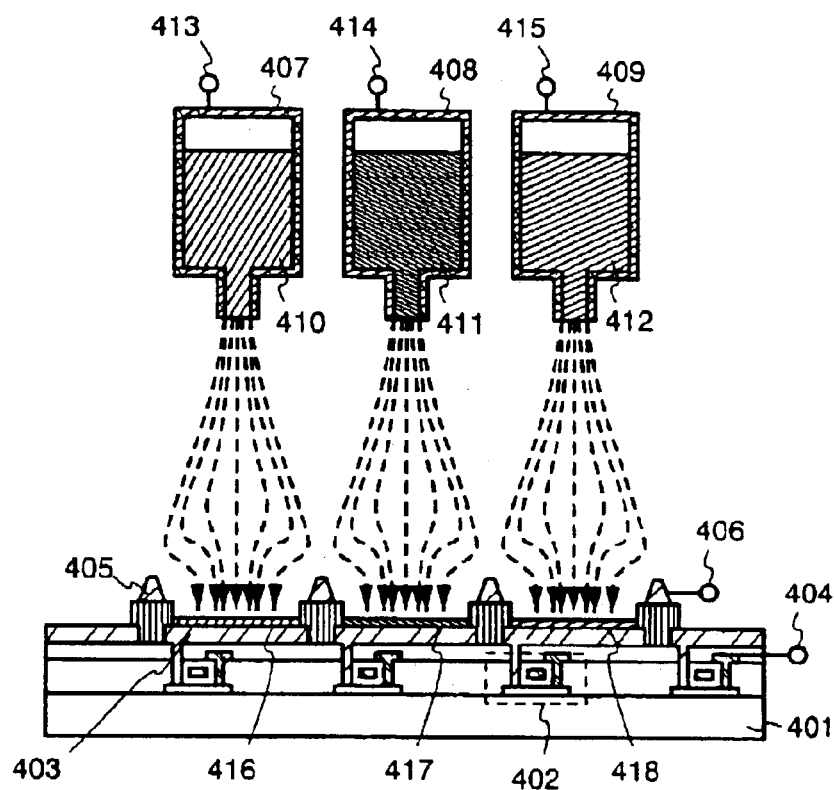
FIGS. 4A and 4B are diagrams for explaining a film deposition process of an EL material by using the ink jet method.
Figure 4B:
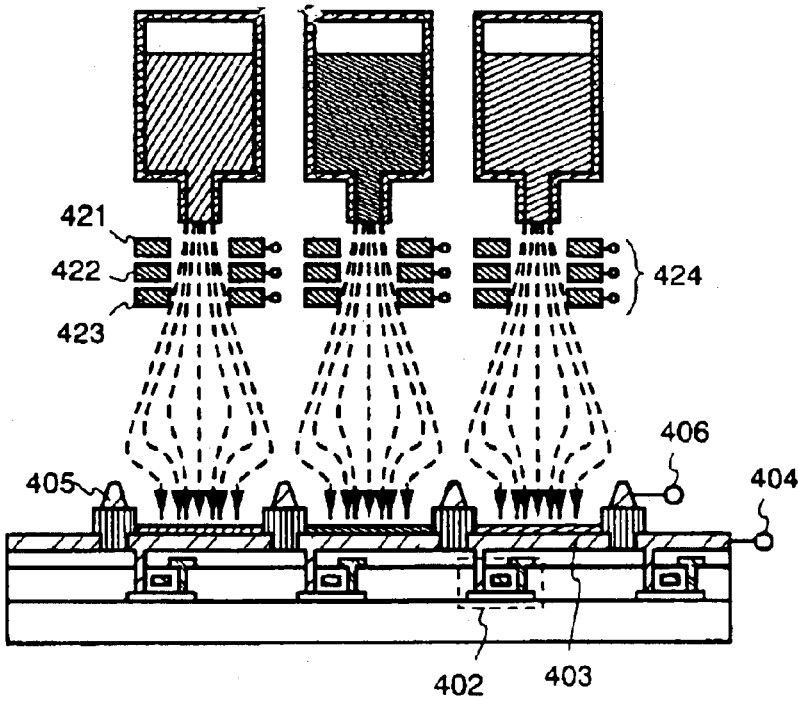

In FIG. 4A, reference symbol 401 denotes a glass substrate, 402 denotes a TFT, 403 denotes a pixel electrode functioning as an anode, and a positive power source 404 is connected to a source wiring of the TFT 402. Further, a negative power source 406 is connected to a controlling bank 405 in Embodiment 3. In this case, all the controlling banks not shown in the drawing are electrically connected so that they all have an equivalent electric potential.

Heads 407 to 409 of a thin film formation apparatus for laminating the EL material through the ink jet method are arranged above the substrate 401. A solution 410 containing an EL material for luminescing a red color is provided in the head 407, a solution 411 containing an EL material for luminescing a green color is provided in the head 408, and a solution 412 containing an EL material for luminescing a blue color is provided in the head 409. These solutions containing the EL materials are discharged from the heads by using a piezo device. Of course, the bubble jet system may be used.

In Embodiment 3, negative power sources 413 to 415 are connected to each of the heads 407 to 409 to thereby charge the EL materials 410 to 412 with a negative charge. A solution containing the EL material discharged under this state drops along the trajectory indicated by the dotted line and is applied on the pixel electrode 403 exposed between the banks. That is, the solutions 410 to 412 containing the negatively charged EL material are applied into the pixels avoiding the negatively charged controlling bank 405, as expected.

Thus, an EL layer 416 corresponding to a red color luminescence, an EL layer 417 corresponding to a green color luminescence, and an EL layer 418 corresponding to a blue color luminescence are formed inside the pixel. Note that although only three pixels are shown in the drawing, the EL layers may be formed in one pixel at a time or may be formed in a plurality of three or more pixels at the same time.

Shown in FIG. 4B is an example of providing an electrode in the vicinity of the discharging exit of the heads 407 to 409 for the purpose of charging the solutions containing the EL material. In Embodiment 3, an extraction electrode 421, an accelerating electrode 422, and a controlling electrode 423 are provided in the structure. Further, each of the above electrodes are connected to a power source 424.

The extraction electrode 421 is an electrode for forming an electric field to extract the solutions containing the EL materials from the heads 407 to 409. The accelerating electrode 422 is an electrode for forming an electric field to accelerate the EL material that has been extracted, and the controlling electrode 423 is an electrode for forming an electric field to control the position where the EL material will finally drop. Of course, there is no need to always used these three electrodes and there is no need to be limited to these combinations.

In the case of the structure shown in FIG. 4B, any one of the three electrodes is used to charge the solutions containing the EL material with a negative charge. Therefore, without the necessity of particularly providing a power source to the heads 407 to 409, the extracted solutions containing the EL materials themselves can be directly charged with an electric charge. In this case, similar to the case of FIG. 4A, a solution containing the EL material drops along the trajectory indicated by the dotted line and is applied on the pixel electrode 403 exposed between the banks. That is, the negatively charged EL material 410 to 412 are applied into the pixels avoiding the negatively charged controlling bank 405, as expected.

By adopting a structure such as the one described above, the possibility of the trajectory becoming off the point during the application of the EL material by the ink jet method can be substantially reduced, whereby it becomes possible to improve the yield. Accordingly, the manufacturing cost can be reduced.

An example of charging the solutions containing the EL materials with a negative charge was shown in Embodiment 3. However, the solutions may be charged with a positive charge. In that case, the controlling bank 405 and the solutions 410 to 412 containing the EL materials are charged with a positive charge, whereas the pixel electrode 403 is charged with a negative charge.

[Embodiment 4]

Figure 5:
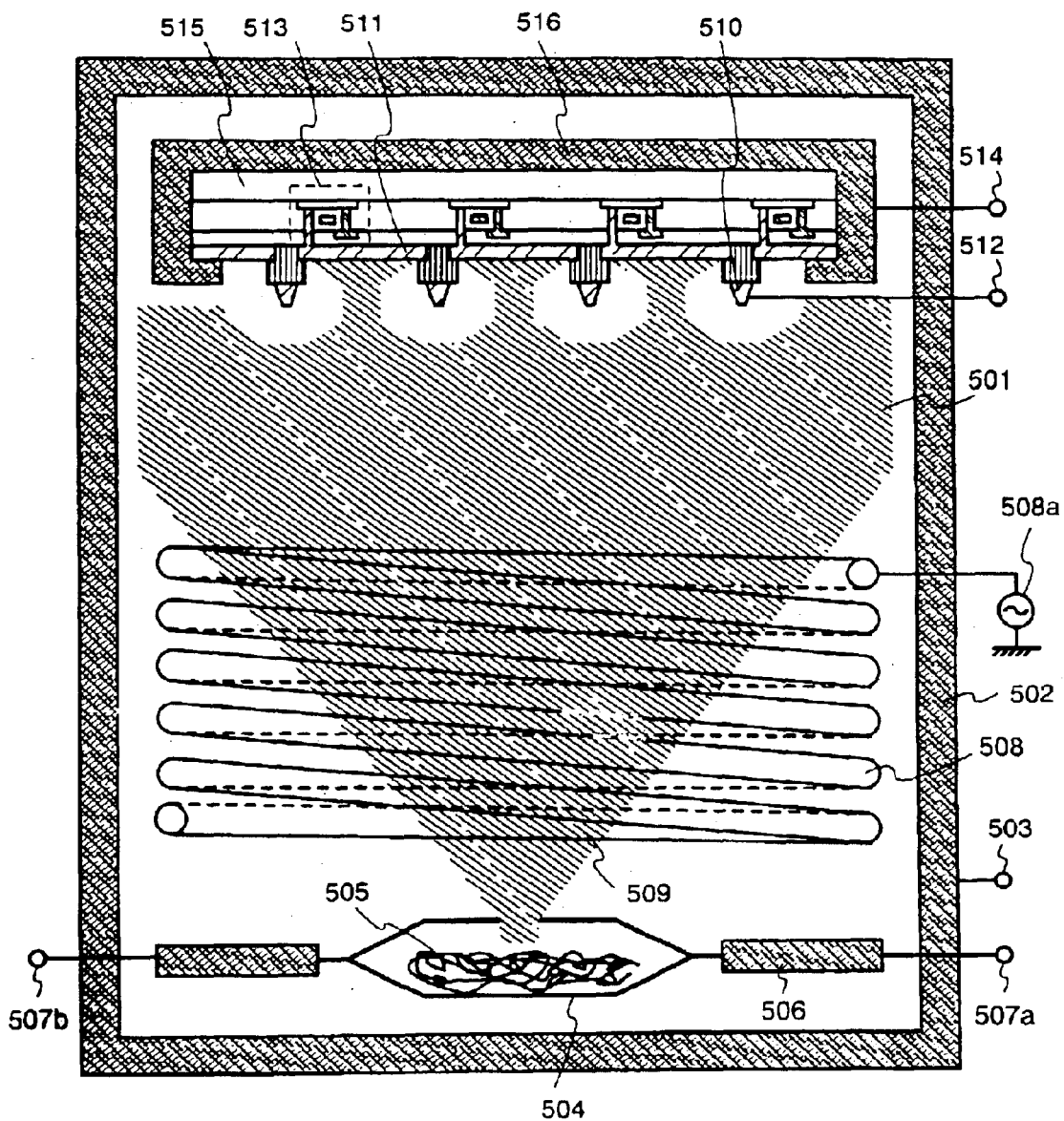
FIG. 5 is a diagram for explaining a film deposition process of an EL material by using the ion plating method.

In Embodiment 5, a case of implementing the present invention when forming the EL layer by using the ion plating method is shown in FIG. 5.

In FIG. 5, reference symbol 501 denotes an evaporation chamber, and a bulkhead 502 of the evaporation chamber is connected to a positive power source 503 that will be applied with a positive voltage. An evaporation boat 504 is provided inside the evaporation chamber 501, and a solid state EL material 505 is provided inside the evaporation boat 504. The evaporation boat 504 is heated by using power sources 507a and 507b, which are connected to a supporting platform 506. That is, Embodiment 4 uses an evaporation source generated by resist heating.

A conductor having an antenna 508 wound into a spiral shape is provided above the evaporation boat 504. The antenna 508 is connected to a high frequency power source 508a and is applied with a high frequency in high vacuum. An electric wave (typically a microwave) can thus be generated. In Embodiment 4, the electric wave is applied to a vaporized gaseous EL material 509 to thereby charge it with a positive charge. At this point, plasma may be generated between the antenna 508. The plasma may be formed by using a noble gas such as argon gas or neon gas. Because the bulkhead 502 of the evaporation chamber is positively charged at this point, the EL material that will adhere to the bulkhead 502 can be suppressed to a minimum.

Avoiding the electric fields formed by controlling banks 510, the scattered gaseous EL material 509 is thus laminated on a pixel electrode 511. A positive power source 512 is connected to the controlling banks 510 to thereby form the electric field. It is to be noted that all the controlling banks not shown in the drawing are electrically connected so that they all have an equivalent electric potential.

Further, at this point, a negative power source 514 is connected to a source wiring of a TFT 513 to which the pixel electrode 511 is connected, so that a negative voltage can be applied to the pixel electrode 511. A substrate 515 having the TFT 513 formed thereon is held by a susceptor 516. The susceptor 516 may be charged with a negative charge during film deposition.

A negative voltage is applied to the pixel electrode 511 by operating the TFT 513, which is electrically connected, to thereby charge the pixel electrode 511 with a negative charge. In other words, Embodiment 4 is characterized in that the EL material is laminated on the pixel electrode under the state of operating the TFT 513. Of course, it is not always necessary that the TFT 513 be operated.

By adopting the above structure, the utilization efficiency of the gaseous EL material 509 that is to be evaporated is enhanced, thereby making it possible to form a desired EL layer with the least essential amount of EL material. Accordingly, the amount of EL material consumed is substantially reduced, and hence the manufacturing cost can be reduced.

Note that although Embodiment 4 takes the method of charging a positive charge to the gaseous EL material 509 by applying the electric field that was formed between the electrodes 508a and 508b, the gaseous EL material 509 can be charged with a positive charge by applying a bias voltage between the anode 511 and the evaporation boat 504.

Further, an example of positively charging the gaseous EL material was shown in Embodiment 4. However, the gaseous EL material may be charged with a negative charge. In that case, the bulkhead 502, the evaporation boat 504, and the controlling banks 510 are charged with a negative charge whereas the anode 511 is charged with a positive charge.

[Embodiment 5]

Figure 6:
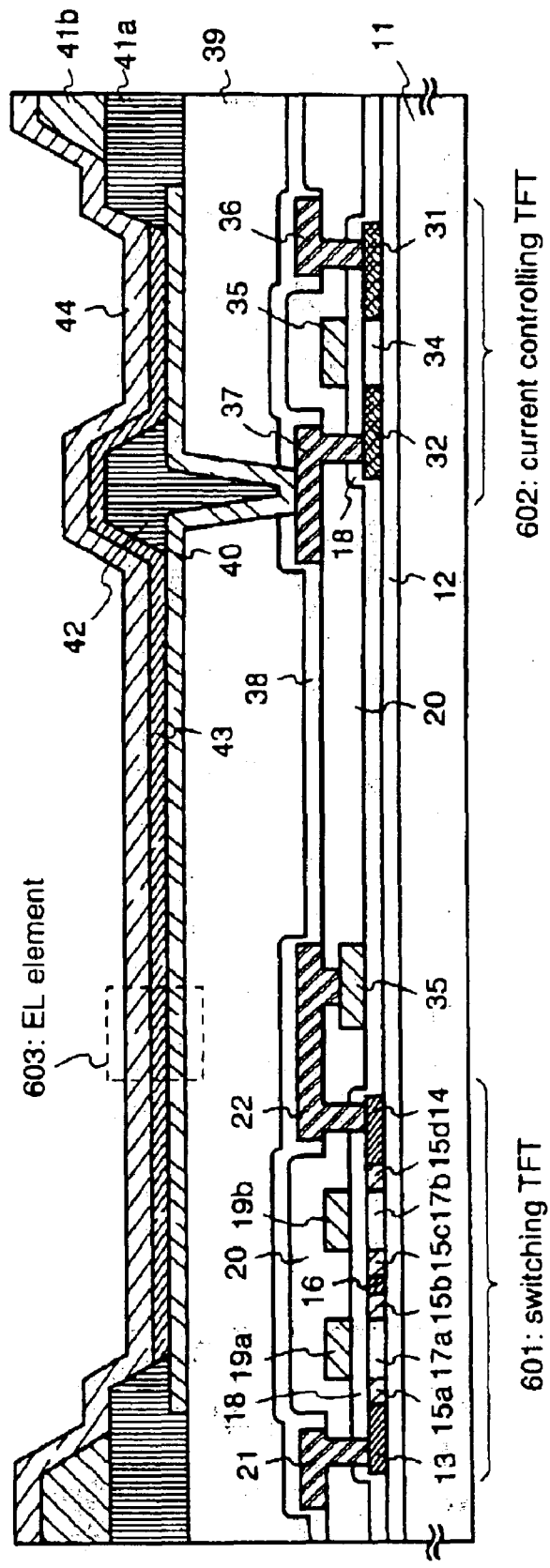
FIG. 6 is a diagram showing a cross-sectional structure of a pixel portion of a light emitting device.
Figure 7A:
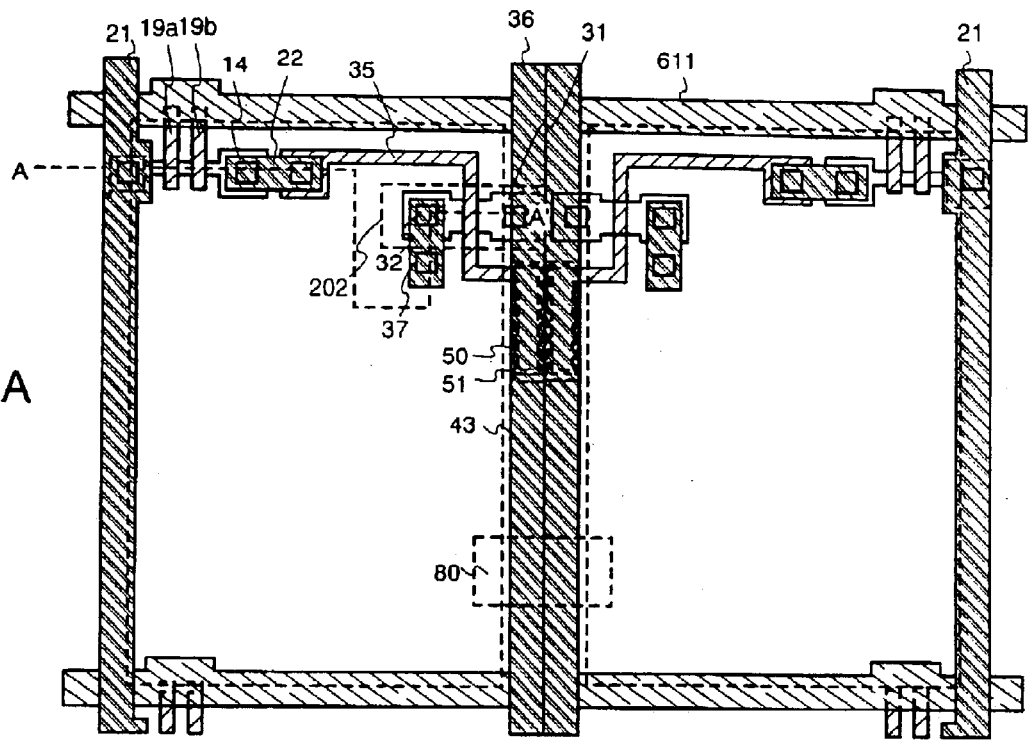
FIGS. 7A to 7C are diagrams showing a top view structure of a pixel portion and a circuit configuration thereof, respectively, of a light emitting device.
Figure 7B:
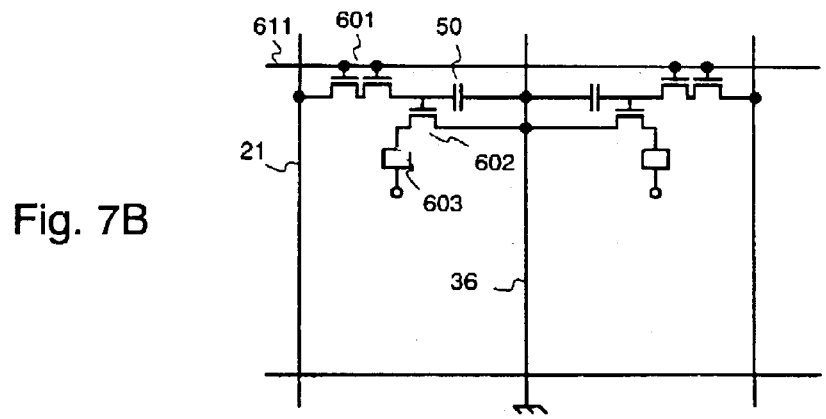
Figure 7C:
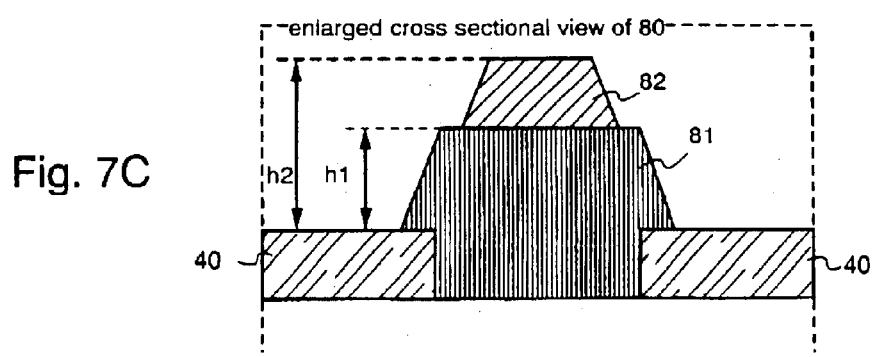

Shown in FIG. 6 is a sectional view of a pixel portion of the light emitting device according to the present invention, and FIG. 7A is a top view of the pixel portion thereof whereas FIG. 7B illustrates the circuit configuration of the pixel portion thereof. Actually, plural pixels are arranged in matrix to thereby form the pixel portion (image display portion). Therefore, common reference symbols are used in FIG. 6 and FIGS. 7A and 7B, and both figures may be conveniently referenced. In addition, two pixels shown in the top view of FIG. 7A share the same structure. FIG. 7C illustrates an enlarged cross sectional view of 80 in FIG. 7A. Reference numerals 81 and 82 denote the supporting bank and controlling bank, respectively.

In FIG. 6, reference symbol 11 denotes a substrate and reference symbol 12 denotes an insulating film that serves as a base (hereinafter referred to as a base film). Substrates usable as the substrate 11 include a glass substrate, a glass ceramic substrate, a quartz substrate, a silicon substrate, a ceramic substrate, a metal substrate, and a plastic substrate.

The base film 12 is effective particularly in using a substrate containing a movable ion or a substrate having a conductivity. However, the base film is not necessarily provided on a quartz substrate. An insulating film containing silicon is suitable as the base film 12. To give heat releasing action to the base film 12 to release heat generated from the TFT is also effective in preventing degradation of the TFT or degradation of the EL element. Any known material may be used to impart the heat releasing effect to the base film.

In Embodiment 5, two TFTs are formed in each pixel. Reference symbol 601 denotes a switching TFT that is formed of an n-channel TFT, and reference symbol 602 denotes a current controlling TFT that is formed of a p-channel TFT.

However, according to the present invention, the switching TFT and the current controlling TFT are not necessarily limited to the above combination of n-channel TFT and p-channel TFT. The switching TFT can be formed of the p-channel TFT whereas the current controlling TFT can be formed of the n-channel TFT, or the n-channel TFT or the p-channel TFT may be used to form both TFTs.

The switching TFT 601 is formed to have a source region 13, a drain region 14, LDD regions 15a to 15d, an active layer including a high concentration impurity region 16 and channel forming regions 17a and 17b, a gate insulating film 18, gate electrodes 19a and 19b, a first interlayer insulating film 20, a source wiring 21, and a drain wiring 22.

As shown in FIG. 7A, the gate electrodes 19a and 19b constitute the double gate structure in which a gate wiring 611 formed from a different material used for forming the gate electrodes 19a and 19b (a material less resistive than the gate electrodes 19a and 19b) electrically connects the gate electrode 19a to the gate electrode 19b. The structure of the gate electrodes of course is not limited to the double gate structure, but may be formed to have a single gate structure or a triple gate structure, that is, the so called multi-gate structure (a structure containing an active layer that has two or more channel forming regions connected in series). The multi-gate structure is extremely effective in terms of reducing an OFF current value. Therefore, the switching element 601 of the pixel is formed to have a multi-gate structure in the present invention to thereby realize a switching element having a low OFF current value.

The active layer is formed of a semiconductor film containing a crystalline structure. In other words, the active layer may be formed of a single crystal semiconductor film or it may be formed of a poly-crystalline semiconductor film or a micro-crystalline semiconductor film. Further, the gate insulating film 18 may be formed of an insulating film containing silicon. All kinds of conductive films can be used as the gate electrodes, the source wiring, or the drain wiring. Furthermore, the LDD regions 15a to 15d in the switching TFT 601 are formed so as not to overlap with the gate electrodes 19a and 19b through the gate insulating film 18 sandwiched therebetween. This structure is very effective in lowering the OFF current value.

Note that it is even more preferable to provide an off set region (a region which is formed from a semiconductor layer having the same composition as the channel forming regions and to which a gate voltage is not applied) between the channel forming regions and the LDD regions to reduce the OFF current value. In addition, in the case where the switching TFT 601 is a multi-gate structure having more than two gate electrodes, then the high concentration impurity region provided between the channel forming regions is effective in reducing the OFF current value.

Next, the current controlling TFT 602 is formed to have a source region 31, a drain region 32, an active layer including a drain region 32 and a channel forming region 34, a gate insulating film 18, a gate electrode 35, a first interlayer insulating film 20, a source wiring 36, and a drain wiring 37. It is to be noted that the gate electrode 35 is formed having a single gate structure, but it may take a multi-gate structure.

As shown in FIG. 7A, the drain of the switching TFT 601 is connected to the gate of the current controlling TFT 602. To be more specific, the gate electrode 35 of the current controlling TFT 602 is electrically connected to the drain region 14 of the switching TFT 601 via the drain wiring 22 (may also be called a connecting wiring). Further, the source wiring 36 is a current supply line and is connected to a supply source of the current flowing to the EL element.

Although the current controlling TFT 602 is an element for controlling the amount of current injected into the EL element 603, taking into consideration the deterioration of the EL element, it is not preferable to cause too large a current to flow in the current controlling TFT 602. Therefore, it is preferable that a channel length (L) of the current controlling TFT 602 is designed longer so that excessive current will not flow therein. Desirably, the channel length thereof is designed so that it is between 0.5 and 2 $\mu$A (preferably between 1 and 1.5 $\mu$A) per pixel.

In addition, the length (width) of the LDD region that is formed in the switching TFT 601 may be between 0.5 and 3.5 $\mu$m, typically between 2.0 and 2.5 $\mu$m.

As shown in FIG. 7A, in a region denoted by the reference symbol 50, a wiring including the gate electrode 35 of the current controlling TFT 602 is formed to overlap with an insulating film and the source wiring (current supply line) 36 of the current controlling TFT 602 sandwiched therebetween. In the region denoted by the reference symbol 50, a storage capacitor (condenser) is formed at this point. A semiconductor film 51 that is electrically connected to the source wiring 36, an insulating film (not shown in the figure) formed on the same layer as the gate insulating film, and a capacitance formed by the power source supply line 36 may be used as the storage capacitor 50.

The storage capacitor 50 functions as a condenser for maintaining the voltage that is applied to the gate electrode 35 of the current controlling TFT 602.

Further, from the perspective of increasing the amount of current that may flow, it is also effective to make the film thickness of the active layer (particularly the channel forming region) of the current controlling TFT 602 thicker (preferably between 50 and 100 nm, further preferably between 60 and 80 nm). Conversely, from the perspective of making the OFF current value smaller in the case of the switching TFT 601, it is effective to make the film thickness of the active layer (particularly the channel forming region) of the switching TFT 601 thinner (preferably between 20 and 50 nm, further preferably between 25 and 40 nm).

In the case of performing a gradation display by means of an analog gradation system, operating the current controlling TFT 602 in a saturated region is preferable. On the other hand, in the case of performing the gradation display by means of a digital gradation system, it is preferable to operate the current controlling TFT 602 in a linear region.

Next, reference symbol 38 denotes a passivation film and the film thickness thereof may be between 10 nm and 1 $\mu$m (preferably between 200 and 500 nm). As a material for forming the passivation film 38, an insulating film containing silicon (a silicon oxynitride film or a silicon nitride film is particularly preferable) can be used.

A second interlayer insulating film (may also be called a planarizing film) 39 is formed on the passivation film 38 so as to cover each of the TFTs to thereby level out a level difference caused by the TFTs. A preferred material for the second interlayer insulating film 39 is an organic resin film, and a polyimide film, a polyamide film, an acrylic resin film, a BCB (benzocyclobuten) film, and the like, are also appropriate. Of course, an inorganic film may be used if it can satisfactorily level out the level difference.

It is very important to level out the level difference caused by the TFT using the second interlayer insulating film 39. The EL layer to be formed later is extremely thin so that the existence of a level difference may lead to inferior light emission. Therefore, planarization before formation of a pixel electrode is desirable, so that the EL layer can be formed on a surface as flat as possible.

Denoted by reference symbol 40 is a pixel electrode formed from a transparent conductive film (corresponds to the anode of the EL element). The pixel electrode 40 is formed by opening a contact hole (aperture) piercing through the second interlayer insulating film 39 and the passivation film 38, and then being brought into connection, in the thus formed aperture portion, with the drain wiring 37 of the current controlling TFT 602.

In Embodiment 5, a conductive film made of a compound of indium oxide and tin oxide is used as the pixel electrode 40. In addition, a small amount of gallium may be doped therein. A compound of indium oxide and zinc oxide or a compound of zinc oxide and gallium oxide may also be used.

Upon formation of the pixel electrode 40, a supporting bank 41a made of a resin film is formed, and a controlling bank 41b made of a metal film is formed thereon. At the same time, an insulating film 42 for filling up the contact hole of the pixel electrode 40 (hereinafter referred to as a filling-up material) is formed. In Embodiment 5, the supporting bank 41a and the filling-up material 42 are formed from an acrylic film, and the controlling bank 41b is formed from a tungsten film.

At this point, the supporting bank 41a and the filling-up material 42, which are made from acrylic, are formed to a film thickness of 300 nm or less, preferably between 100 and 200 nm. It is preferable that the supporting bank 41a and the filling-up material 42 are formed so that the edge portions thereof are taper shaped. Further, the controlling bank 41b that is made from a tungsten film is also formed so that the edge portion thereof is preferably taper shaped.

As shown in FIG. 1A, the supporting bank 41a and the controlling bank 41b are formed surrounding the edge portions of the pixel electrode 40.

An EL layer 43 is formed next by using the film deposition methods explained in FIGS. 2 to 5. It is to be noted that although only one pixel is shown here, EL layers corresponding to each of the colors R (red), G (green), and B (blue) are formed. In Embodiment 5, the evaporation method illustrated in FIG. 2 is adopted, and a low molecular weight type EL material is used as the EL material.

Note that as the EL materials used in Embodiment 5, a material using Alq as the host material and doped with a red fluorescent pigment DCM is used for the EL layer luminescing a red color. Further, for the EL layer luminescing a green color, $Alq_3$, which is an aluminum-8-hydroxyquinoline complex, is used, and a benzoxazole complex of zinc ($Zn(oxz)_2$) is used for the EL layer luminescing a blue color.

However, the examples of the materials mentioned above are merely an example of EL materials usable as the EL layer of the present invention, and that there is no need to limit the EL material to these. That is, high molecular weight type EL materials that are not described here may be used, and furthermore, a low molecular weight type EL material and a high molecular weight type material may be used together.

Thus, upon forming the EL layer 43, a cathode 44 is next formed from a metal film. In Embodiment 5, an alloy film in which lithium is doped into aluminum is used as the cathode 44. Note that an insulating film may be formed on the cathode 44 as a passivation film (not shown in the figure).

An EL element 603 that is composed of the pixel electrode 40, the EL layer 43, and the cathode 44 is thus formed. Actually, it is desirable that the structure of the EL element is formed in a way so that the EL element does not come into contact with the open air. In order to prevent-exposure to the open air, after forming the EL element 603, a covering member is provided on the EL element 603 to thereby perform sealing under an inert atmosphere, or sealing is performed by providing resin on the entire surface thereof.

The provision of a moisture absorbent agent (typically barium oxide) or an antioxidant in the airtight space or the resin is also effective.

Any one of the structures of Embodiments 1 to 4 can be used to manufacture the light emitting device of Embodiment 5.

[Embodiment 6]

In Embodiment 6, an explanation is made on a method of manufacturing a pixel portion and a TFT of a driver circuit portion simultaneously that is provided in the periphery of the pixel portion with reference to FIGS. 8A to 10C. However, in order to simplify the explanation, a CMOS circuit, which is the basic circuit for the driver circuit, is shown in the figures.

Figure 8A:
FIGS. 8A to 8E are views showing a manufacturing process of a light emitting device.

First, as shown in FIG. 8A, a base film 801 is formed to a thickness of 300 nm on a glass substrate 800. A lamination film constituting a 100 nm thick silicon oxynitride film and a 200 nm thick silicon oxynitride film is used as the base film 801 in Embodiment 6. At this point, it is appropriate to set the nitrogen concentration of the silicon oxynitride film that is in contact with the glass substrate 800 to between 10 and 25 wt %. Of course, an element may be directly formed on a quartz substrate without the provision of the base film.

Next, an amorphous silicon film (not shown in the figure) is formed to a thickness of 50 nm on the base film 801 by using a known film deposition method. Note that the present invention is not necessarily limited to using the amorphous silicon film, but a semiconductor film containing an amorphous structure (including a micro-crystalline semiconductor film) may be used. In addition, a compound semiconductor film containing an amorphous structure such as an amorphous silicon germanium film may also be used, and the film thickness thereof may be between 20 and 100 nm.

The amorphous silicon film is then crystallized by a known method to thereby form a crystalline silicon film (also referred to as a polycrystalline silicon film or a polysilicon film) 802. Thermal crystallization using an electric furnace, laser annealing crystallization using a laser, and lamp annealing crystallization using infrared light exist as known crystallization methods. Crystallization is performed in Embodiment 6 using light from an excimer laser which uses XeCl gas.

Note that the pulse emission type excimer laser light processed into a linear shape is used in Embodiment 6, but a rectangular shape may also be used, and that continuous emission type argon laser light and continuous emission excimer type laser light can also be used.

Figure 8B:
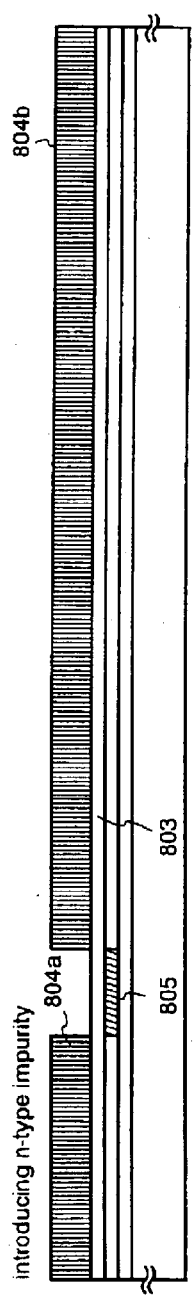

In Embodiment 6, although the crystalline silicon film is used as the active layer of the TFT, it is also possible to use an amorphous silicon film. Furthermore, it is also possible to use the amorphous silicon to form the active layer of the switching TFT, which requires a lowering of the OFF current value, while using the crystalline silicon film to form the active layer of the current controlling TFT. Carrier mobility is low in the amorphous silicon film, and therefore it is difficult for a current to flow therein, and as a result, it is difficult for an OFF current to flow. That is, the merits of both the amorphous silicon film in which it is hard to flow a current therein and the crystalline silicon film in which it is easy to flow a current therein can be utilized advantageously. Next, as shown in FIG. 8B, a protective film 803 made of a silicon oxide film is formed to a thickness of 130 nm on the crystalline silicon film 802. The thickness thereof may be chosen from within the range of 100 to 200 nm (preferably between 130 and 170 nm). Furthermore, other films may also be used provided that they are insulating films containing silicon. The protective film 803 is provided so that the crystalline silicon film is not directly exposed to plasma during the doping of an impurity and to make it possible to have delicate concentration control of the impurity.

Resist masks 804a and 804b are then formed on the protective film 803, and an impurity element that imparts n-type conductivity (hereafter referred to as n-type impurity element) is doped therein through the protective film 803. Note that elements belonging to the Periodic Table Group 15 are generally used as the n-type impurity element. Typically, phosphorus or arsenic can be used. Also note that in Embodiment 6, a plasma (ion) doping method in which phosphine ($PH_3$) is plasma activated without separation of mass is used, and that phosphorus is doped at a concentration of $1\times10^{18}$ atoms/cm$^3$. The ion implantation method, in which separation of mass is performed, may also be used, of course.

In an n-type impurity region 805 thus formed by this process, the dose amount of the n-type impurity element contained therein is regulated so that the concentration thereof is $2\times10^{16}$ to $5\times10^{19}$ atoms/cm$^3$ (typically between $5\times10^{17}$ and $5\times10^{18}$ atoms/cm$^3$).

Figure 8C:
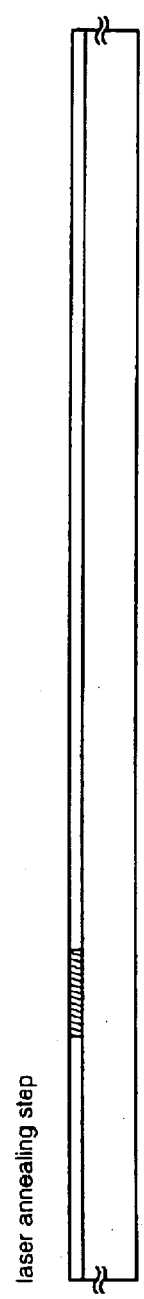

Next, as shown in FIG. 8C, the protective film 803 and the resists 804a and 804b are removed to thereby activate the element belonging to Periodic Table Group 15 that is doped therein. A known activation technique may be used as the means of activation, and in Embodiment 6, activation is conducted by irradiation of an excimer laser light. Without being necessarily limited to the use of the excimer laser light, a pulse emission type excimer laser and a continuous emission type excimer laser may both, of course, be used. The aim here is the activation of the doped impurity element, and therefore it is preferable that irradiation is performed at an energy level at which the crystalline silicon film does not melt. Note that the laser irradiation may also be performed with the protective film 803 provided thereon.

It is to be noted that during the activation of the impurity element by laser light, activation by heat treatment may also be performed along therewith. When activation is performed by heat treatment, in considering the heat resistance of the substrate, it is appropriate to perform a heat treatment on the order of 450 to 550° C.

Figure 8D:
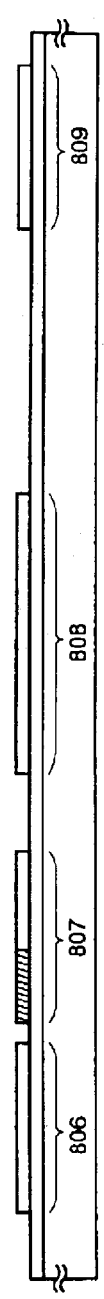

Due to this process, edge portions of the n-type impurity region 805, that is, a boundary portion (connecting portion) and regions existing in the periphery of the n-type impurity regions 805 and not doped with the n-type impurity element will become distinct. This means that, at the point when the TFTs are later completed, extremely good connecting portions can be formed between LDD regions and channel forming regions. As shown in FIG. 8D, unnecessary portions of the crystalline silicon film are removed next to thereby form island-like semiconductor films (hereinafter referred to as active layers) 806 to 809.

Figure 8E:
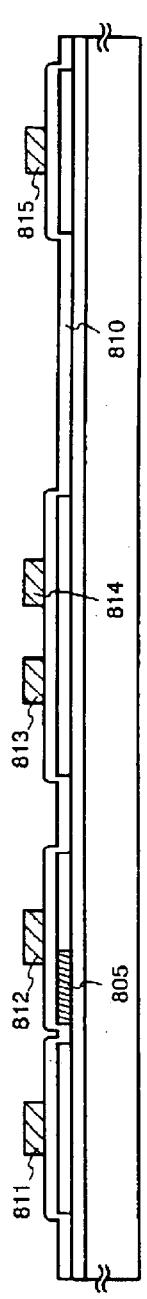

Then, as shown in FIG. 8E, a gate insulating film 810 is formed covering the active layers 806 to 809. An insulating film containing silicon and having a thickness of 10 to 200 nm, preferably between 50 and 150 nm, may be used as the gate insulating film 810. The film thereof may take a single layer structure or a lamination structure. A 110 nm thick silicon oxynitride film is used in Embodiment 6.

A 200 to 400 nm thick conductive film is formed next and patterned, thereby forming gate electrodes 811 to 815. The edge portions of the gate electrodes 811 to 815 may be formed into taper shapes. Note that in Embodiment 6, the gate electrodes and lead wirings that are electrically connected to the gate electrodes (hereinafter referred to as gate wirings) are formed from different materials. Specifically, a material having a lower resistance than that of the gate electrodes is used as the gate wirings. The reason for this resides in that a material which is capable of being microprocessed is used as the gate electrodes, and even if the material for the gate wirings cannot be micro-processed, materials having lower resistance is used for the gate wirings. Of course, the gate electrodes and the gate wirings may also be formed from the same material.

Further, the gate electrodes may be formed from a single layer conductive film, and if necessary, it is preferable to use a two layer or a three layer lamination film. All known conductive films can be used as the material for the gate electrodes. However, as stated above, it is preferable to use a material which can be micro-processed, specifically, a material which can be patterned to a line width of 2 µm or less.

Typically, it is possible to use a film made of an element selected from the group consisting of tantalum (Ta), titanium (Ti), molybdenum (Mo), tungsten (W), chromium (Cr), and silicon (Si), or a nitride film containing the above elements (typically a tantalum nitride film, a tungsten nitride film, or a titanium nitride film), or an alloy film having a combination of the above elements (typically an Mo—W alloy or an Mo—Ta alloy), or a silicide film of the above elements (typically a tungsten silicide film or a titanium silicide film). Of course, the films may be used as a single layer or a laminate layer.

A lamination film that is composed of a 50 nm thick tantalum nitride (TaN) film and a 350 nm thick tungsten (W) film is used in Embodiment 6. These films may be formed by sputtering. Further, when an inert gas such as Xe or Ne is added as a sputtering gas, peeling of the films due to stress can be prevented.

At this point, a gate electrode 812 is formed so as to overlap a portion of the n-type impurity region 805 and the gate insulating film 810, with the gate insulating film 810 sandwiched therebetween. This overlapping portion later becomes an LDD region overlapping the gate electrode. Note that in a cross-sectional view, gate electrodes 813 and 814 can be seen as two electrodes, but they are actually electrically connected.

Figure 9A:
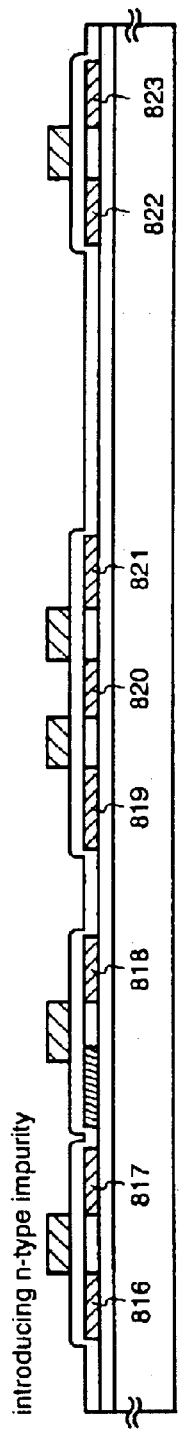
FIGS. 9A to 9D are views showing a manufacturing process of a light emitting device.

Next, as shown in FIG. 9A, an n-type impurity element (phosphorus is used in Embodiment 6) is doped in a self-aligning manner using the gate electrodes 811 to 815 as masks. The doping of phosphorus is regulated so that it can be doped into the impurity regions 816 to 823 thus formed at a concentration of ½ to $\frac{1}{10}$ that of the n-type impurity region 805 (typically between ⅓ and ¼). To be more specific, a concentration of $1\times10^{16}$ to $5\times10^{18}$ atoms/cm$^3$ (typically $3\times10^{17}$ to $3\times10^{18}$ atoms/cm$^3$) is preferable.

Figure 9B:
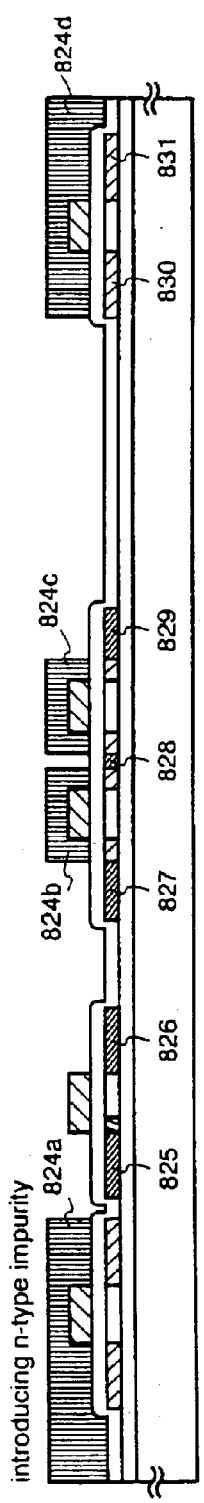

As shown in FIG. 9B, resist masks 824a to 824d are formed next covering the gate electrodes and the like, and an n-type impurity element (phosphorus is used in Embodiment 6) is doped to thereby form impurity regions 825 to 829 containing a high concentration of phosphorus. Ion doping using phosphine (PH$_3$) is also performed here, and the concentration of phosphorus in these regions is regulated so that it is between $1\times10^{20}$ and $1\times10^{21}$ atoms/cm$^3$ (typically between $2\times10^{20}$ and $5\times10^{20}$ atoms/cm$^3$).

A source region or a drain region of the n-channel TFT is formed through this process, and in the switching TFT, a portion of the n-type impurity regions 819 to 821 formed through the process of FIG. 9A remains. These remaining regions correspond to the LDD regions 15a to 15d of the switching TFT 601 in FIG. 6.

Figure 9C:
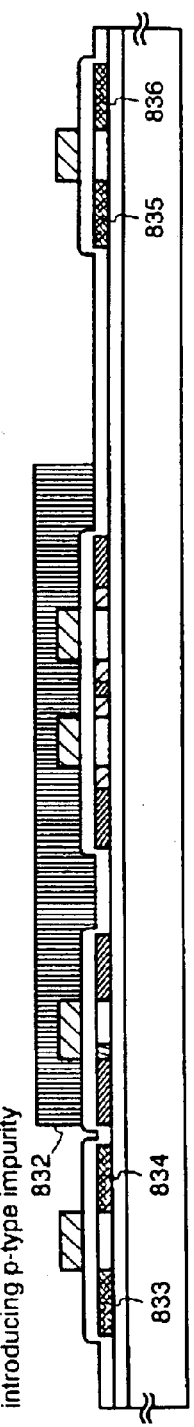

Next, as shown in FIG. 9C, the resist masks 824a to 824d are removed, and a new resist mask 832 is formed. A p-type impurity element (boron is used in Embodiment 6) is then doped to thereby form impurity regions 833 to 836 containing a high concentration of boron. Boron is doped here by ion doping using diborane (B$_2$H$_6$) so that the concentration thereof is $3\times10^{20}$ to $3\times10^{21}$ atoms/cm$^3$ (typically between $5\times10^{20}$ and $1\times10^{21}$ atoms/cm$^3$).

Note that phosphorus has already been doped into the impurity regions 833 to 836 at a concentration of $1\times10^{20}$ to $1\times10^{21}$ atoms/cm$^3$, but boron is doped here at a concentration of at least 3 times higher than that of phosphorus. Therefore, the n-type impurity regions that have been formed in advance are completely inverted to have the p-type conductivity, thereby functioning as p-type impurity regions.

Next, after removing the resist mask 832, the n-type and p-type impurity elements doped at respective concentrations are activated. Furnace annealing, laser annealing, or lamp annealing may be performed as a means of activation. Heat treatment is performed in Embodiment 6 under a nitrogen atmosphere for 4 hours at 550° C. in an electric furnace.

It is important to remove as much oxygen as possible contained in the atmosphere at this point. This is because even a small trace of oxygen exists, then the exposed surface of the electrode is oxidized, inviting an increase in resistance, and at the same time it becomes more difficult to make an ohmic contact later. It is therefore preferable that the concentration of oxygen in the processing environment in the above activation process is set to 1 ppm or less, desirably 0.1 ppm or less.

Figure 9D:
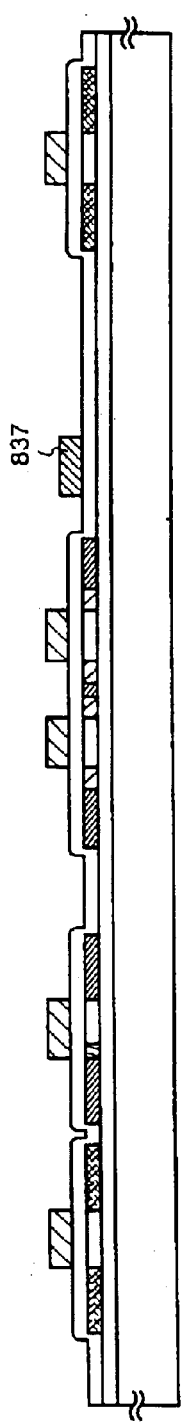

After the activation process is completed, a gate wiring 837 is next formed to a thickness of 300 nm as shown in FIG. 9D. A metal having aluminum (Al) or copper (Cu) as its principal constituent (comprising 50 to 100% of the composition) may be used as the material of the gate wiring 837. Regarding the placement of the gate wiring 837, it is formed so that the gate wiring 611 and the gate electrodes 19a and 19b of the switching TFT (corresponding to gate electrodes 813 and 814 of FIG. 8E) are electrically connected as in FIG. 7.

The wiring resistance of the gate wiring can be made extremely small by forming such a type of structure, and therefore a pixel display region (pixel portion) having a large surface area can be formed. That is, the pixel structure of Embodiment 6 is extremely effective when realizing a light emitting device having a screen size of a 10 inch diagonal or larger (in addition, a 30 inch or larger diagonal).

Figure 10A:
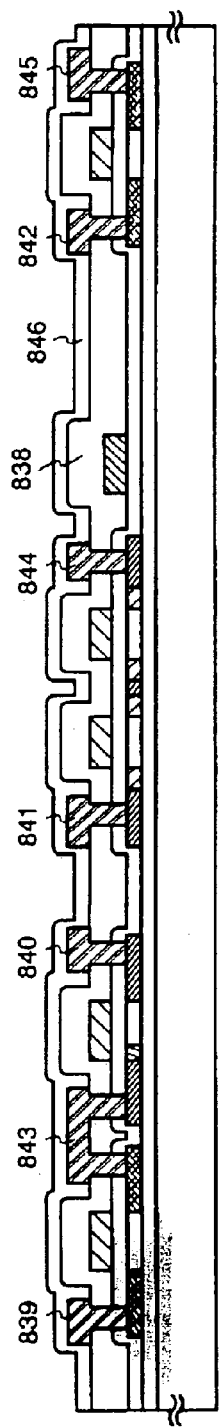
FIGS. 10A to 10C are views showing a manufacturing process of a light emitting device.

Next, as shown in FIG. 10A, a first interlayer insulating film 838 is formed. As the first interlayer insulating film 838, either a single layer insulating film containing silicon is used, or a lamination film in which two or more types of insulating film containing silicon are combined may be used. Further, it is appropriate to set the film thickness thereof between 400 nm and 1.5 µm. A structure in which an 800 nm thick silicon oxide film is formed laminated on a 200 nm thick silicon oxynitride film is used in Embodiment 6.

Additional heat treatment is performed under an atmosphere containing 3% to 100% of hydrogen for 1 to 12 hours at a temperature of between 300° C. and 450° C. to thereby perform hydrogenation. This process is one for terminating the dangling bonds in the semiconductor film caused thermally excited hydrogen. Plasma hydrogenation (using hydrogen generated by plasma) may be performed as another means of hydrogenation.

Note that the hydrogenation process may also be inserted between the step of forming of the first interlayer insulating film 838. That is, hydrogenation processing such as the above may be performed after forming the 200 nm thick silicon oxynitride film, and then the remaining 800 nm thick silicon oxide film may be formed.

Next, a contact hole is formed in the first interlayer insulating film 838 and the gate insulating film 810 to thereby form source wirings 839 to 842 and drain wirings 843 to 845. It is to be noted that in Embodiment 6, this electrode is made of a lamination film composed of a three layer structure in which a Ti film having a thickness of 100 nm, an aluminum film containing Ti and having a thickness of 300 nm, and a Ti film having a thickness of 150 nm are formed in succession by sputtering. Of course, other conductive films may be used.

Next, a first passivation film 846 is formed to a thickness of 50 to 500 nm (typically between 200 and 300 nm). A 300 nm thick silicon oxynitride film is used as the first passivation film 846 in Embodiment 6. This may also be substituted with a silicon nitride film.

Note that it is effective to perform plasma treatment using a gas containing hydrogen such as H$_2$ or NH$_3$ prior to the formation of the silicon oxynitride film. Hydrogen excited by this pre-process is supplied to the first interlayer insulating film 838, and the film quality of the passivation film 846 is improved by performing heat treatment. At the same time, the hydrogen doped into the first interlayer insulating film 838 diffuses to the lower layer side, and therefore the active layers can be effectively hydrogenated.

Figure 10B:
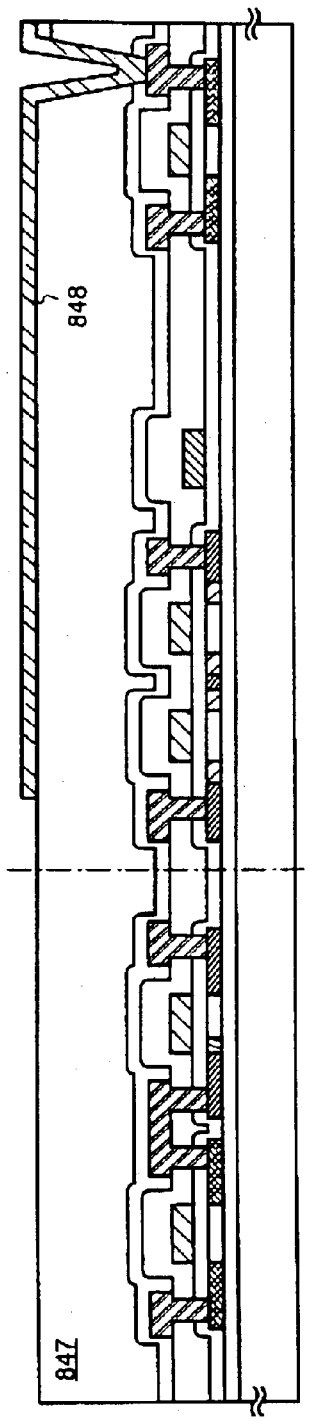

Next, as shown in FIG. 10B, a second interlayer insulating film 847 made of an organic resin is formed. As the organic resin, materials such as polyimide, polyamide, acrylic resin, or BCB (benzocyclobutene) can be used. In particular, because the second interlayer insulating film 847 is primarily used for leveling, acrylic resin that has excellent leveling properties is preferable. In Embodiment 6, an acrylic resin film is formed to a thickness that is sufficient to level a step difference formed by TFTs. A preferred film thickness thereof is between 1 to 5 μm (more preferably between 2 and 4 μm).

A contact hole is formed in the second interlayer insulating film 847 and the first passivation film 846 to thereby form a pixel electrode 848 to be electrically connected to the drain wiring 845. In Embodiment 6, an indium tin oxide (ITO) film is formed to a thickness of 110 nm, and patterning is carried out to thereby form the pixel electrode. Incidentally, as other materials, it is also possible to use a compound in which 2 to 20% of zinc oxide (ZnO) is mixed in indium oxide or a compound constituting zinc oxide and gallium oxide may be used as a transparent electrode. The pixel electrode 848 becomes the anode of the EL element.

Figure 10C:
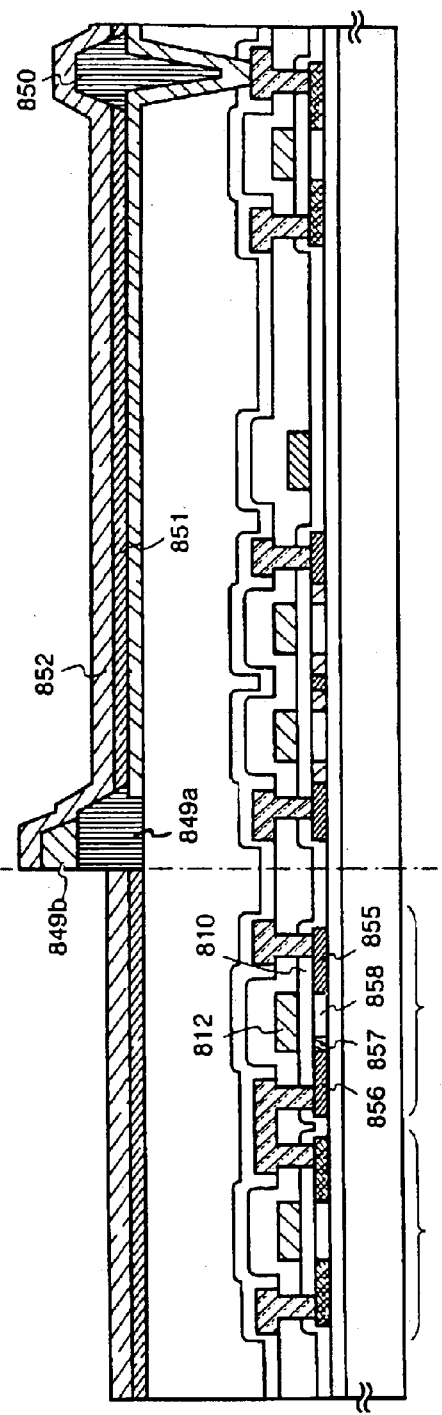

As shown in FIG. 10C, a supporting bank 849a and a filling-up material 850 made of resin are formed next. An acrylic film is formed to a thickness of 500 nm, and thereafter, etching is performed so that the film thickness thereof becomes 200 nm. Then the acrylic film is patterned to thereby form the supporting bank 849a and the filling-up material 850 to have the shape as shown in FIG. 10C.

A controlling bank 849b made of a metal film is further formed on the supporting bank 849a. In Embodiment 6, a tungsten film is used as the metal film, and it is formed into a taper shape during etching. A technique for forming a taper shape disclosed in Japanese Patent Application Laid-Open No.2001-035808 by the present applicant may be referenced.

An EL layer 851 is formed next by using the methods that were illustrated in FIGS. 2 to 5. It is to be noted that although only one pixel is shown here, the EL layers corresponding to each of the colors R (red), G (green), and B (blue) are formed. As the EL materials used in Embodiment 6, a material that uses Alq, as the host material and doped with a red fluorescent pigment DCM is used for the EL layer luminescing a red color. Further, for the EL layer luminescing a green color, $Alq_3$, which is an aluminum-8-hydroxyquinoline complex, is used, and a benzoxazole complex of zinc $(Zn(oxz)_2)$ is used for the EL layer luminescing a blue color. The respective EL layers are formed to a thickness of 50 nm.

It is to be noted that in Embodiment 6 the EL layer 851 it takes a single layer structure. However, an electron injecting layer, an electron transporting layer, a hole transporting layer, a hole injecting layer, an electron preventing layer, or a hole element layer may be provided if necessary.

A cathode 852 made of an alloy film constituting aluminum and lithium is formed by vacuum evaporation after the formation of the EL layer 851. It is to be noted that the film thickness of the EL layer 851 may appropriately be formed to between 30 and 100 nm (typically between 50 and 80 nm) and the thickness of the cathode 852 to between 150 and 300 nm (typically between 200 and 250 nm). Although Embodiment 6 shows an example of using the alloy film of aluminum and lithium as the cathode 852 of the EL element, other known materials may be used. Shown in FIGS. 11A and 11B here is the cross-sectional structure of an n-channel TFT when it is used as the switching TFT. First, in FIG. 11A, the LDD regions 15a to 15d provided so as not to overlap with the gate electrodes 19a and 19b through the gate insulating film 18 sandwiched therebetween. Such structure is very effective in lowering the OFF current value.

Figure 11A:
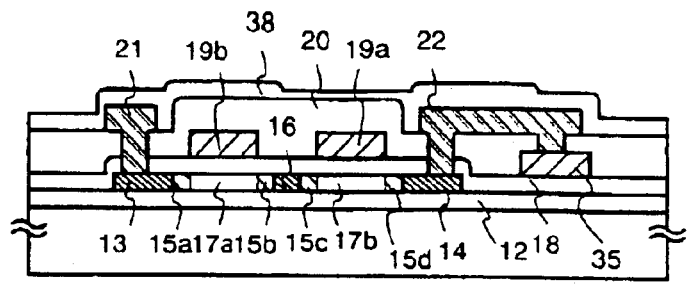
FIGS. 11A and 11B are views showing a structure of a switching TFT.
Figure 11B:
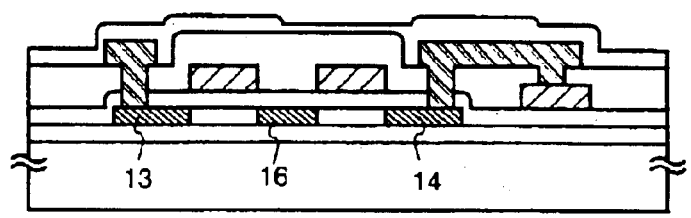

With respect to the above structure of FIG. 11A, in the structure thereof shown in FIG. 11B, the LDD regions 15a to 15d are not provided. In the case of adopting the structure of FIG. 11B, productivity can be improved because the number of processes can be reduced when compared with case of forming the structure of FIG. 11A.

In the present invention, a TFT may take either structure shown in FIGS. 11A and 11B as the switching TFT.

Figure 12A:
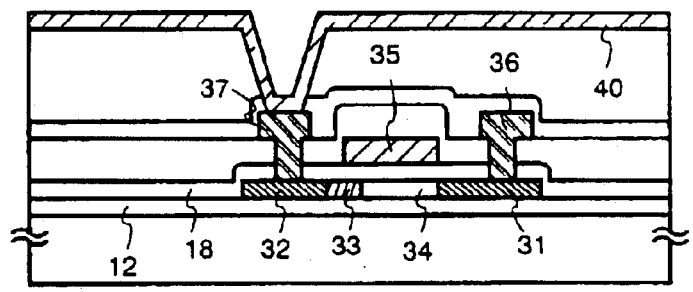
FIGS. 12A and 12B are views showing a structure of a current controlling TFT.
Figure 12B:
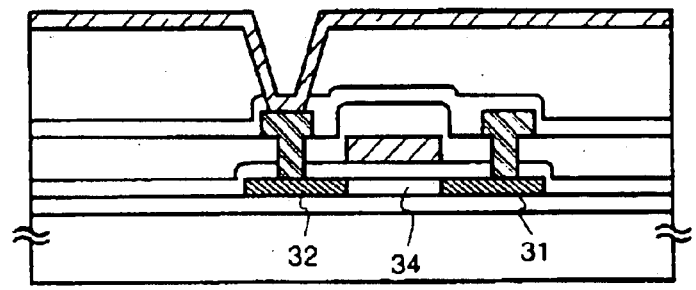

Next, in the case of using an n-channel TFT as the current controlling TFT, the cross-sectional structure views thereof is illustrated in FIGS. 12A and 12B. First, in the current controlling TFT shown in FIG. 12A, the LDD region 33 is provided between the drain region 32 and the channel forming region 34. The structure of the current controlling TFT shown here has a region where the LDD region 33 overlaps with the gate electrode 35 through the gate insulating film 18 sandwiched therebetween and a region where the LDD region 33 does not overlap with the gate electrode 35. However, as shown in FIG. 12B, the LDD region 33 need not be provided in the structure thereof.

The current controlling TFT supplies a current for causing the EL element to emit light, and at the same time controls the supply amount to enable gradation display. Thus, it is necessary to take a countermeasure against deterioration due to the hot carrier injection so that deterioration does not occur even if a current is supplied.

Regarding deterioration caused by the hot carrier injection, it is known that a structure where the LDD region overlaps with the gate electrode is very effective. Therefore, the structure in which the LDD region is provided overlapping with the gate electrode 35 through the gate insulating film 18 sandwiched therebetween as shown in FIG. 12A is appropriate. However, in the structure shown here, the LDD region is provided so as not to overlap with the gate electrode as a countermeasure against the OFF current value. Nevertheless, an LDD region not overlapping the gate electrode does not have to be necessarily provided.

Further, if a voltage that is applied between the source region and the drain region of the current controlling TFT is 10 V or less, preferably 5 V or less, then hot carrier deterioration cease to become a problem, whereby the LDD region need not be provided in the structure as shown in FIG. 12B.

In the case of Embodiment 6, as shown in FIG. 10C, the active layer of the n-channel TFT 605 contains a source region 855, a drain region 856, an LDD region 857, and a channel forming region 858. The LDD region 857 overlaps with the gate electrode 812 through the gate insulating film 810 sandwiched therebetween.

The LDD region is formed only on the drain region side in consideration of not to drop the operating speed. Further, it is not necessary to pay very much attention to the OFF current value in the n-channel TFT 605, but rather, it is better to place importance on the operating speed. Thus, it is desirable that the LDD region 857 is formed to completely overlap with the gate electrode to reduce the resist component to a minimum. That is, it is preferable to remove the so-called offset. An active matrix substrate having a structure as shown in FIG. 10C is thus completed. In the active matrix substrate of Embodiment 6, a TFT having an optimum structure is not only provided in the pixel portion but also in the driver circuit portion. Therefore, very high reliability is attained and operating characteristics may be improved.

First, a TFT having a structure that will decrease hot carrier injection so as not to drop the operating speed thereof as much as possible is used as the n-channel TFT 605 of a CMOS circuit forming the driver circuit portion. Incidentally, the driver circuit here includes a shift register, a buffer, a level shifter, a sampling circuit (sample and hold circuit) and the like. In the case of performing digital driving, a signal conversion circuit such as a D/A converter is also included therein.

Further, after completing through FIG. 10C, actually, the packaging (sealing) of the active matrix substrate with a covering member such as glass, quartz, or plastic, which has airtightness properties, is preferably performed so that the substrate is not exposed to the open air. At that point, it is appropriate to place a moisture absorbent agent such as barium oxide or an anti-oxidant inside the covering member.

After enhancing the airtightness by conducting the packaging process or the like, a connecter (flexible printed circuit: FPC) for connecting the element formed on the insulator or a terminal lead out from the circuit to an external signal terminal is attached, whereby the light emitting device is completed as a product. In this specification, the product in such a state that it can be shipped is called an EL display device (or an EL module).

Note that an IC using a single crystal silicon may be provided as the driver circuit for transmitting a signal to the pixel portion, a memory, a control circuit, a power source circuit or the like. In this case, the IC may be connected by using a TAB or a COG, or a method of connecting the IC that is incorporated in a printed wiring board with a TAB tape may be adopted.

An explanation will be made here on the structure of the light emitting device of Embodiment 6 with reference to the perspective view of FIG. 13. The light emitting device of Embodiment 6 is composed of a pixel portion 1302, a gate side driver circuit 1303, and a source side driver circuit 1304 formed on a glass substrate 1301. A switching TFT 1305 of the pixel portion is an n-channel TFT and is arranged at an intersection point of a gate wiring 1306 that is connected to the gate side driver circuit 1303 and a source wiring 1307 that is connected to the source side driver circuit 1304. Further, a drain of the switching TFT 1305 is connected to a gate of a current controlling TFT 1308. A reference numeral 1315 denotes a capacitor.

Further, a source side of the current controlling TFT 1308 is connected to a power supply line 1309. An EL element 1310 is connected to a drain of the current controlling TFT 1308. Further, a predetermined voltage is applied to the cathode of the EL element 1310.

Connecting wirings 1312 and 1313 for transmitting signals to the driver circuit portion and a connecting wiring 1314 connected to the power supply line 1309 are provided in an FPC 1311 serving as an external input/output terminal.

Figure 13:
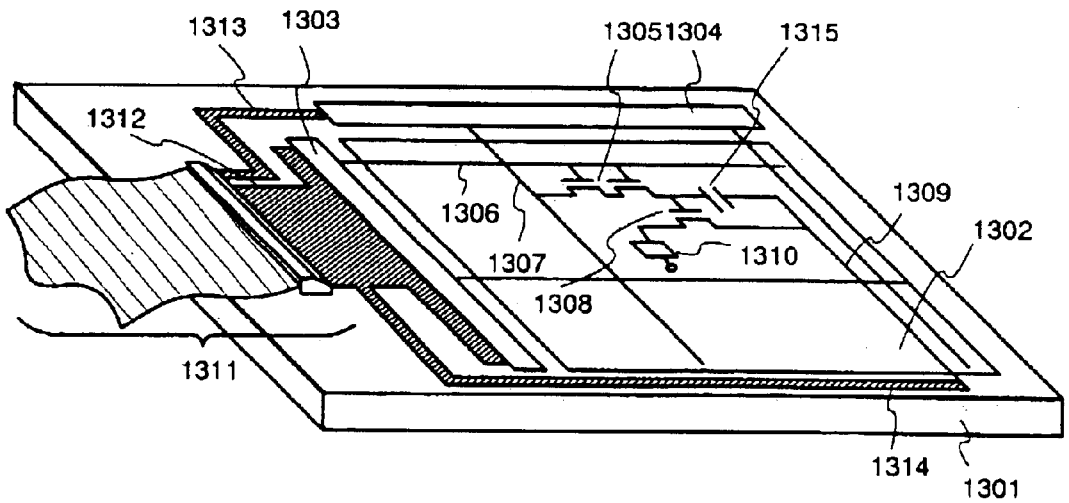
FIG. 13 is a drawing showing the outer appearance of a light emitting device.
Figure 14:
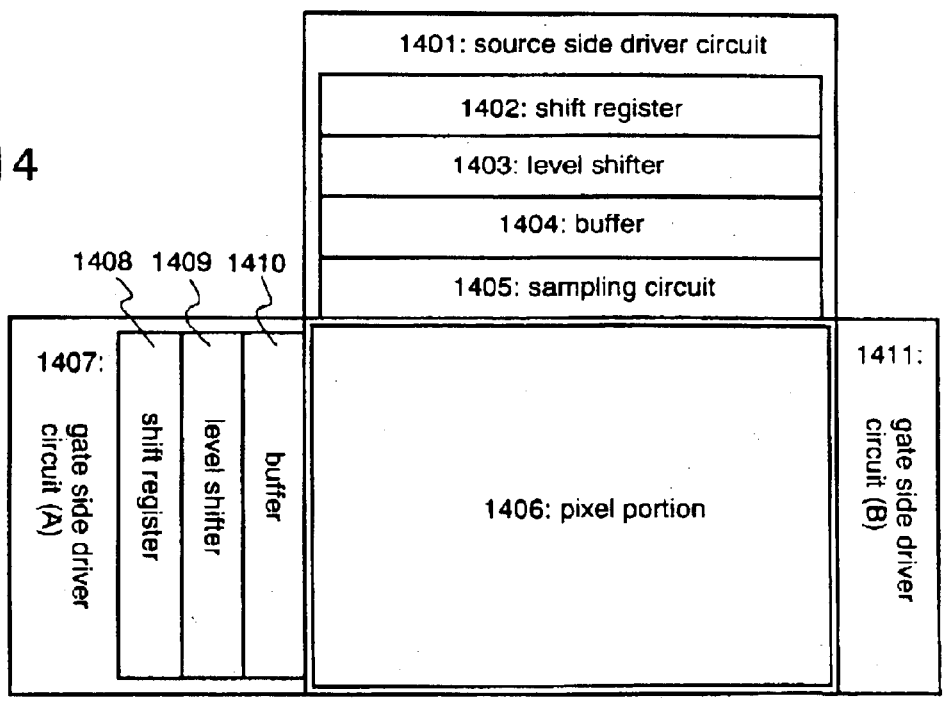
FIG. 14 is a diagram illustrating a circuit configuration of a light emitting device.

An example of a circuit configuration of the light emitting device shown in FIG. 13 is illustrated in FIG. 14. The light emitting device of Embodiment 6 includes a source side driver circuit 1401, a gate side driver circuit (A) 1407, a gate side driver circuit (B) 1411, and a pixel portion 1406. Note that in this specification, the term "driver circuit portion" is a generic term including the source side driver circuit and the gate side driver circuit.

The source side driver circuit 1401 is provided with a shift register 1402, a level shifter 1403, a buffer 1404, and a sampling circuit (transfer gate) 1405. Further, the gate side driver circuit (A) 1407 is provided with a shift register 1408, a level shifter 1409, and a buffer 1410. The gate side driver circuit (B) 1411 also takes the same structure.

Here, the shift registers 1402 and 1408 have driving voltages of 5 to 16 V (typically 10 V), respectively, and the structure indicated by reference symbol 605 in FIG. 10C is suitable for the n-channel TFT that is used in a CMOS circuit for forming the circuits.

Similar to the shift register, the CMOS circuit including the n-channel TFT 605 of FIG. 10C is suitable for each of the level shifters 1403 and 1409 and the buffers 1404 and 1410. Incidentally, it is effective that the gate wiring is formed such that it takes a multi-gate structure such as a double gate structure or a triple gate structure in improving the reliability of each circuit.

The structure of the pixel illustrated in FIG. 6 is arranged in the pixel portion 1406.

The foregoing structure can be easily realized by manufacturing TFTs in accordance with the manufacturing steps shown in FIGS. 8A to 10C. In Embodiment 6, although only the structure of the pixel portion and the driver circuit portion is shown, it is possible to form a logical circuit other than the driver circuit, such as a signal dividing circuit, a D/A converter circuit, an operational amplifier circuit, or a a-correction circuit, on the same insulator if the manufacturing steps of the circuits are carried out in accordance with those of Embodiment 6. In addition, it is considered that a memory portion, a microprocessor, or the like can be formed on the same insulator.

The EL module of Embodiment 6 including the covering member will be explained with reference to FIGS. 15A and 15B. Note that the reference symbols used in FIGS. 13 and 14 will be referred to, if necessary.

Figure 15A:
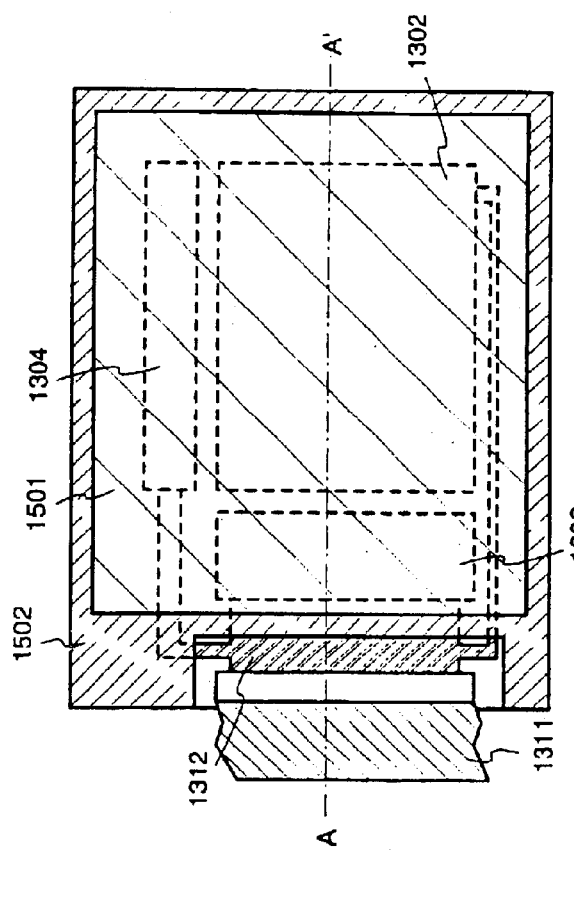
FIGS. 15A and 15B are diagrams showing a top view structure and a cross-sectional structure, respectively, of a light emitting device.

Shown in FIG. 15A is a top view of a state in which a sealing structure is provided to the structure shown in FIGS. 10A to 10C. Reference symbol 1302 denotes the pixel portion, reference symbol 1303 denotes the gate side driver circuit, and 1304 denotes the source side driver circuit, which are indicated by dotted lines. The sealing structure of the present invention is a structure which is provided to the state shown in FIG. 10 and is composed of a filling member (not shown in the figure), a covering member 1501, a sealing member (not shown in the figure), and a framing member 1502.

Figure 15B:
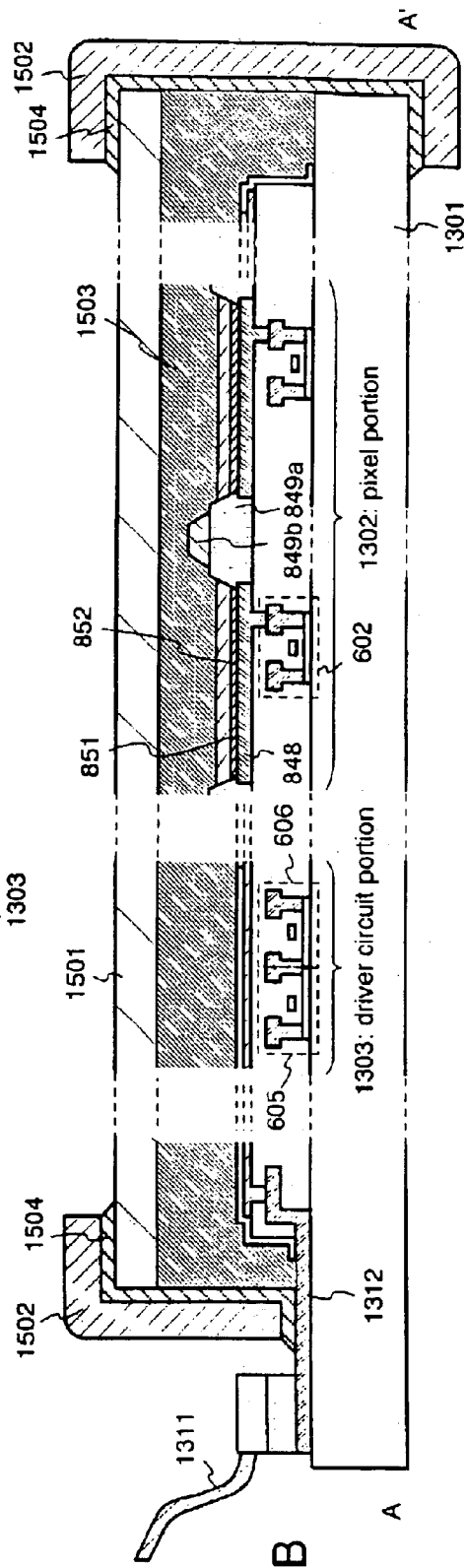

A sectional view taken along the line A–A' of FIG. 15A is shown here in FIG. 15B. Note that in FIGS. 15A and 15B, the same reference symbols are used to denote the same components. As shown in FIG. 15B, the pixel portion 1302 and the gate side driver circuit 1303 are formed on the glass substrate 1301. The pixel portion 1302 is composed of a plurality of pixels each including the current controlling TFT 602 and the pixel electrode 848 that is electrically connected to the current controlling TFT 602. The gate side driver circuit 1303 is formed using a CMOS circuit in which the n-channel TFT 605 and the p-channel TFT 606 are combined complementarily.

The pixel electrode 848 functions as the anode of the EL element. The supporting bank 849a and the controlling bank 849b are formed in the gap between the pixel electrodes 848 to thereby form the EL layer 851 and the cathode 852 inside of the supporting bank 849a and the controlling bank 849b. Of course, the structure of the EL element may be inverted, and the pixel electrode may function as the cathode.

In the case of Embodiment 6, the cathode 852 also functions as a common wiring shared by all the pixels, and is electrically connected to the FPC 1311 via the connecting wiring 1312.

Next, a filling member 1503 is provided so as to cover the EL element. The filling member 1503 functions as an adhesive for bonding the covering member 1501. As the filling member 1503, PVC (polyvinyl chloride), epoxy resin, silicone resin, PVB (polyvinyl butylal), or EVA (ethylenevinyl acetate) can be used. A drying agent (not shown) placed inside the filling member 1503 keeps moisture absorbing effect, which is preferable. At this point, the drying agent may be an additive of the filling member or may be sealed within the filling member.

A material made of glass, plastic, or ceramic can be used as the covering member 1501 in Embodiment 6. Note that doping a moisture absorbent material such as barium oxide in the filling member 1503 in advance is effective.

Then, after bonding the covering member 1501 by using the filling member 1503, the framing member 1502 is attached so as to cover the sides (exposed faces) of the filling member 1503. The framing member 1502 is bonded by using the sealing member (functions as an adhesive) 1504. At this time, a photo curable resin is preferably used for the sealing member 1504. However, a thermosetting resin may also be used if the heat resistivity of the EL layer is permitted. A desirable material of the sealing member 1504 is one which allows minimum amount of moisture and oxygen to permeate. A drying agent may be doped into the sealing member 1504. By sealing the EL element within the filling member 1503 using the method as described above, the EL element is completely cut off from external environment, and the invasion from the outside by substances that accelerate the oxidation degradation of the EL layer, such as moisture and oxygen, can thus be prevented. Accordingly, an EL display device with high reliability can be manufactured.

A polarizing plate may be provided on the display surface (surface for observing an image) of the light emitting device shown in Embodiment 6. The polarizing plate has the effect of suppressing the reflection of light entered from the outside to thereby prevent an observer from being reflected on the display surface. Generally, a circular polarizing plate is used. However, in order to prevent the light emitted from the EL layer from being reflected by the polarizing plate and reversed back into the interior thereof, a refractive index is regulated to thereby form a desirable structure having very little interior reflection.

[Embodiment 7]

A case of sequentially laminating the anode, the EL layer, and the cathode on the insulator was chiefly explained in Embodiments 1 through 6. However, it is possible to laminate the cathode, the EL layer, the anode, and an auxiliary wiring on the insulator in order.

While, in the former lamination structure, light penetrating the insulator is observed, in the latter lamination structure, light is irradiated in the direction away from the insulator.

[Embodiment 8]

Figure 16:
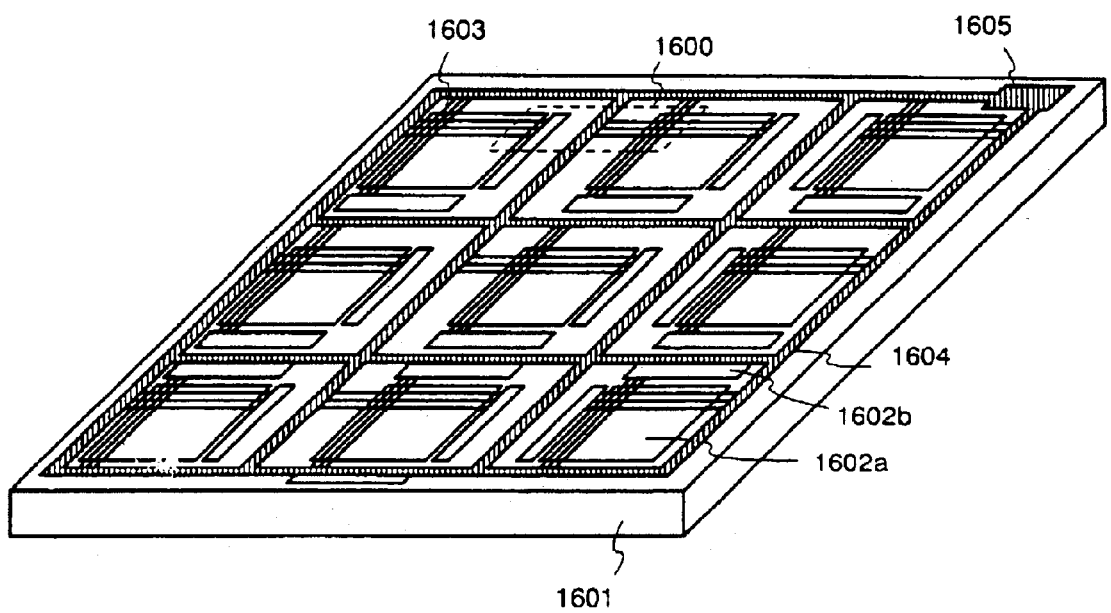
FIG. 16 is a diagram for explaining a gang-printing process.

In Embodiment 8, an explanation is made on an example of implementing the present invention to a case of manufacturing a plurality of light emitting devices from one piece of substrate by means of gang-printing. The explanation thereof is made with reference to FIG. 16.

A plurality of light emitting devices each containing a pixel portion 1602a and a driver circuit 1602b are formed on a glass substrate 1601. Nine light emitting devices will be formed on one piece of glass substrate in this embodiment. Further, the pixel portion 1602a of each of the light emitting devices is formed of the structure illustrate in FIG. 1, and a controlling bank 1603 is formed in a matrix shape in each pixel portion 1602a.

A wiring (hereinafter referred to as a bank connecting wiring) 1604 for connecting each of the controlling banks so that all the controlling banks 1603 have equivalent electric potential is formed in Embodiment 8. If a voltage is applied to a pad portion 1605, the applied voltage will be transmitted to all the anodes. A characteristic of this embodiment is that the bank connecting wiring 1604 can be used as an electrostatic countermeasure. In other words, if all the controlling banks 1603 have equivalent electric potential, then a large voltage will not suddenly be applied between the wiring, whereby destruction of the substrate can be effectively suppressed.

Figure 17A:
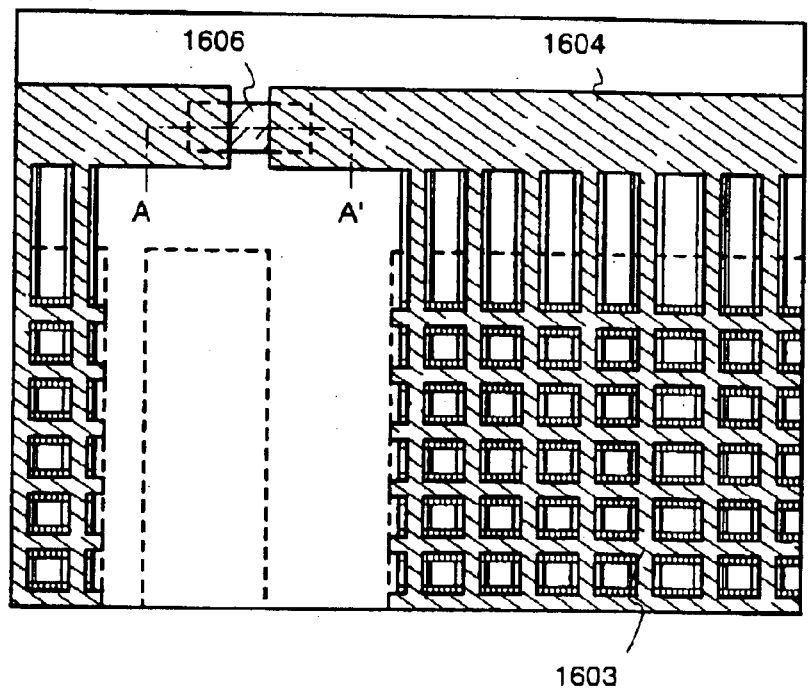
FIGS. 17A and 17B are diagrams for explaining a gang-printing process.

An enlarged view of a region 1600 surrounded by the dotted line is shown in FIG. 17A here. As shown in FIG. 17A, the bank connecting wiring 1604 is formed at the same time with the controlling bank 1603 and part of the way, has a portion that is coupled with a buffer wiring 1606. The buffer wiring 1606 is formed simultaneously with the pixel electrode (the anode of the EL element in this embodiment) by using an oxide conductive film.

Figure 17B:
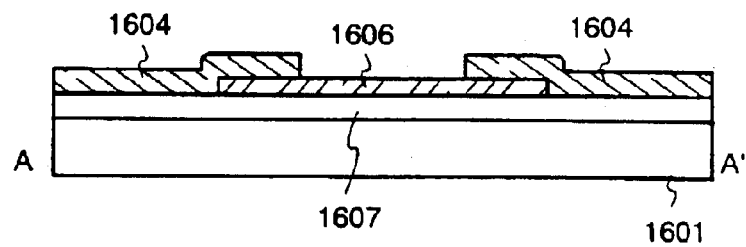

A cross-sectional view taken along the line A–A' of FIG. 17A is shown in FIG. 17B. Note that reference symbol 1607 denotes an interlayer insulating film that is laminated in the process of manufacturing a TFT.

Because a resistance value of the oxide conductive film used as the buffer wiring 1606 is high compared with a metal film, the buffer wiring functions one kind of resistor. Therefore, if a large current flows in the bank connecting wiring 1604, the current is buffered by the buffer connecting wiring, thereby making it possible to prevent damages to the plurality of light emitting devices.

By adopting the structure of Embodiment 8, the present invention may be implemented even in the case of manufacturing a plurality of light emitting devices in one time by means of the gang-printing process without providing complicated wiring.

Further, upon completion of the light emitting device, the substrate 1601 is cut by using a dicer or a scriber to thereby separate each of the light emitting devices. At this point, if the bank connecting wiring 1604 is cut, then the respective light emitting devices become a state of being electrically independent. It is to be noted that the structure of Embodiment 8 may be implemented by freely combining it with any one of the structures of Embodiments 1 to 7.

[Embodiment 9]

Figure 18:
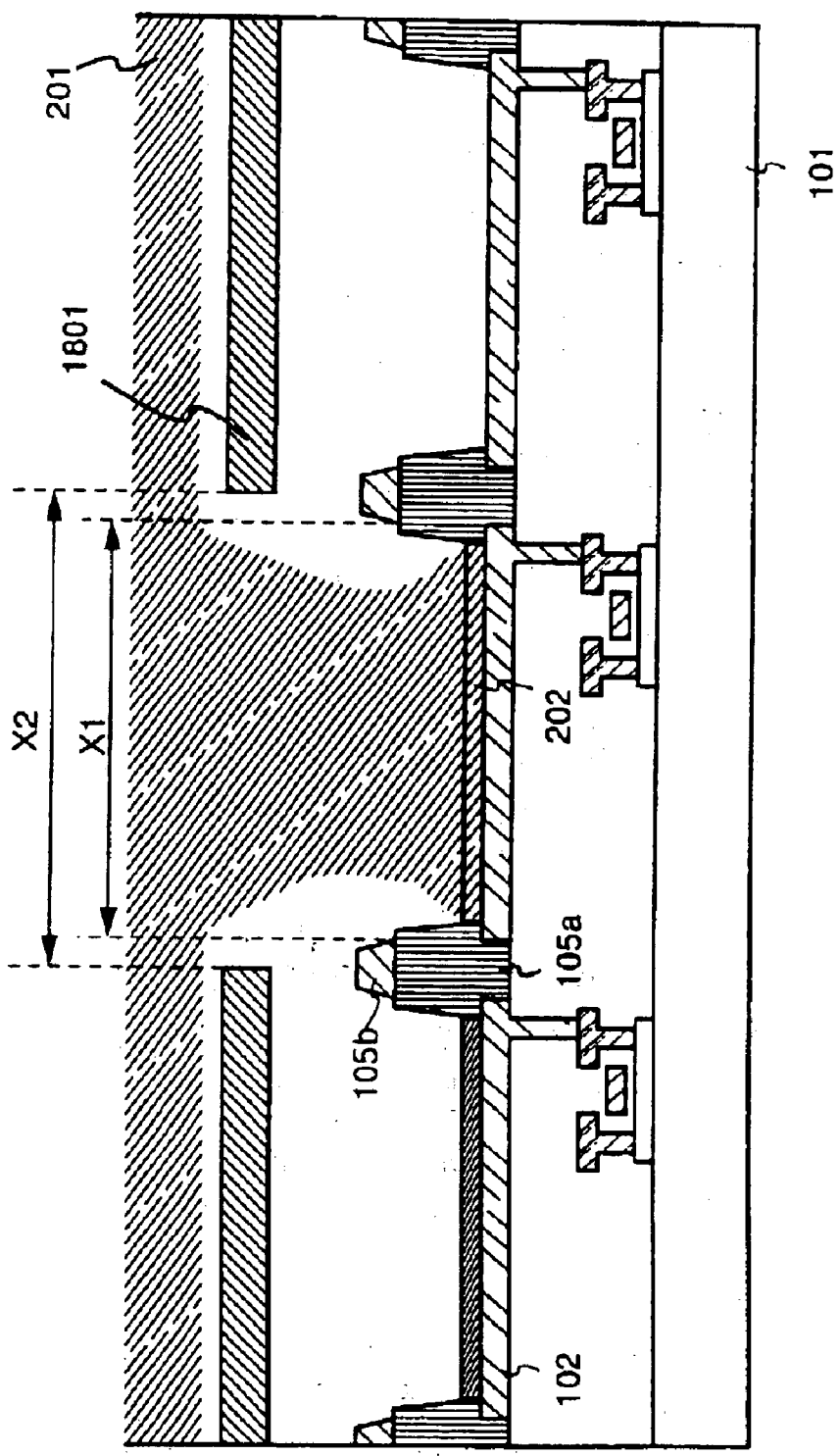
FIG. 18 is a diagram for explaining a film deposition process of an EL material.

A case of using a combination of the present invention and a shadow mask is explained in Embodiment 9 with reference to FIG. 18. Note that the same reference symbols are used to denote components similar to those in the structure shown in FIG. 2.

In FIG. 18, a shadow mask 1801 is further provided on a controlling bank 105b, and the shadow mask 1801 is charged with a negative charge. In other words, the shadow mask 1801 and the controlling bank 105b are charged to have the same polarity.

At this point, if a distance between the respective controlling banks 105b is denoted by $X_1$ and a distance of an aperture provided in the shadow mask 1801 is denoted by $X_2$, then it is preferable to make the relation between the two distances to $X_1 < X_2$. Thus, the EL material (or a solution containing the EL material) 201 coming from the top of the shadow mask 1801 will first be guided to the vicinity of the aperture of the shadow mask 1801 by the electric field that is generated by the shadow mask 1801. The EL material 201 will further be guided into the pixel by the electric field formed by the controlling bank 105b. The EL layer 202 is thus formed.

The structure of Embodiment 9 is particularly effective in the case of separating the different kinds of EL material into several times to thereby form the EL layers, as in the case of forming the EL layers by separating the EL material for luminescing a red color, the EL material for luminescing a green color, and the EL material for luminescing a blue color.

It is to be noted that the structure of Embodiment 9 may be implemented by freely combining it with any one of the structures of Embodiments 1 to 8.

[Embodiment 10]

A case of separating an EL material for luminescing a red color, an EL material for luminescing a green color, and an EL material for luminescing a blue color b an electric field control of the present invention to thereby form the EL layers without using a shadow mask will be explained in Embodiment 10.

Figure 19A:
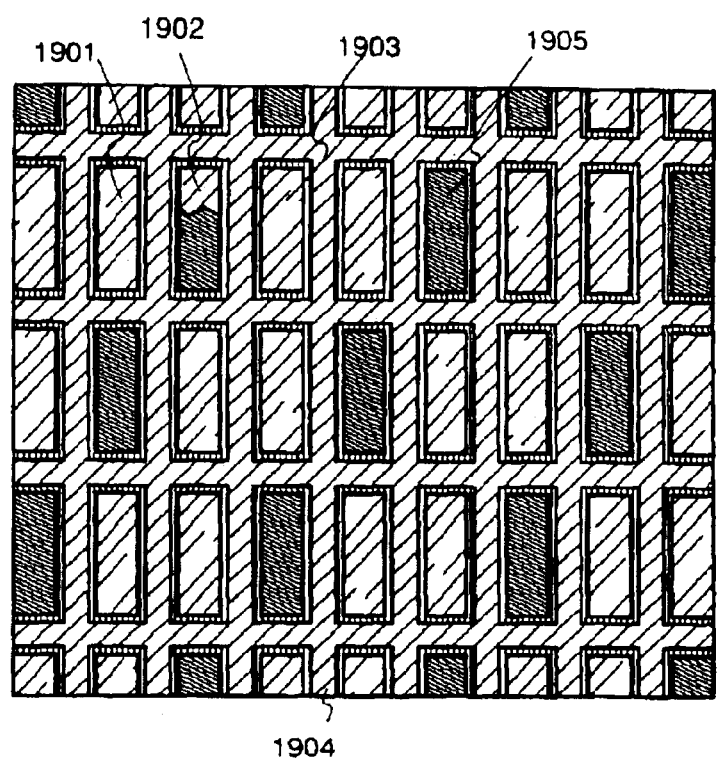
FIGS. 19A and 19B are diagrams for explaining a film deposition process of an EL material.
Figure 19B:
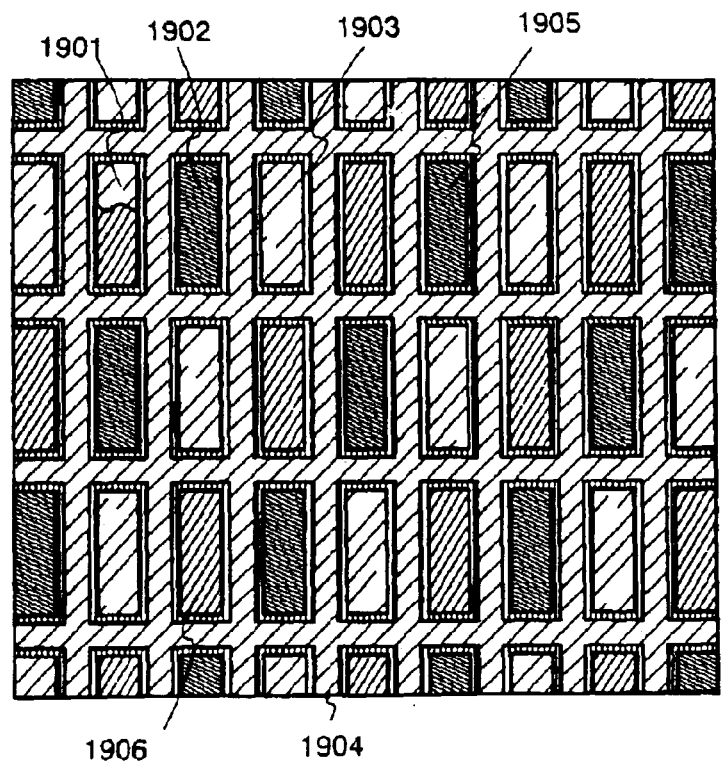

The concept of Embodiment 10 is shown in FIGS. 19A and 19B. In FIGS. 19A and 19B, pixel electrodes 1901 to 1903 are formed on an insulator (in Embodiment 10, the insulator is an interlayer insulating film formed on an TFT) not shown in the figure. Controlling banks 1904 are formed and processed into a matrix shape to thereby surround the above electrodes.

In Embodiment 10, first as shown in FIG. 19A, only the pixel electrode 1902 is charged with a positive charge and the other pixel electrodes 1901 and 1903 are charged with a negative charge. Further, the controlling bank 1904 is also charged with a negative charge. The negatively charged EL material for luminescing a red color is then formed by evaporation under this state. At this point, on the pixel electrodes 1901 and 1903 that have been charged with a negative charge, the EL material is repelled, whereby most of the EL material is film deposited on the anode 1902 that has been charged with a positive charge. An EL layer 1905 for luminescing a red color is thus formed.

Next, as shown in FIG. 19B, only the pixel electrode 1901 is charged with a positive charge and the other pixel electrodes 1902 and 1903 are charged with a negative charge. Further, the controlling bank 1904 is also charged with a negative charge. The negatively charged EL material for luminescing a green color is then formed by evaporation under this state. At this point, on the pixel electrodes 1902 and 1903 that have been charged with a negative charge, the EL material is repelled, whereby most of the EL material is film deposited on the pixel electrode 1901 that has been charged with a positive charge. An EL layer 1906 for luminescing a green color is thus formed.

Furthermore, although not shown in the figure, an EL layer for luminescing a blue color is similarly formed by only charging the pixel electrode 1903 with a positive charge and charging the other pixel electrodes 1901 and 1902 with a negative charge to thereby film deposit the EL material for luminescing a blue color.

With the structure of Embodiment 10, film deposition of the EL material can be selectively performed on the pixels without the use of the shadow mask by controlling the EL material with the electric field formed by the controlling bank 1904 and the electric field formed by the pixel electrodes 1901 to 1903 to thereby determine the track of the EL material.

It is to be noted that the structure of Embodiment 10 may be implemented by freely combining it with any one of the structures of Embodiments 1 to 8.

[Embodiment 11]

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

Chemical formula 1

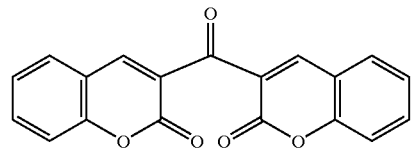

(M. A. Baldo, D. F. O'Brien, Y. You, A. Shoustikov, S. Sibley, M. E. Thompson, S. R. Forrest, Nature 395 (1998) p.151.)

The molecular formula of an EL material (Pt complex) reported by the above article is represented as follows.

Chemical formula 2

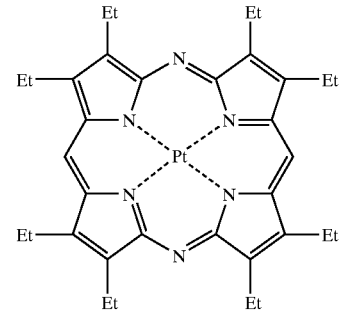

(M. A. Baldo, S. Lamansky, P. E. Burrows, M. E. Thompson, S. R. Forrest, Appl. Phys. Lett., 75 (1999)P.4)

(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

Chemical formula 3

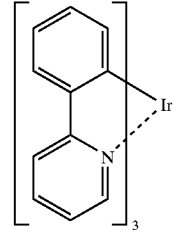

As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to ninth embodiments.

[Embodiment 12]

The light emitting apparatus formed according to the present invention, is a self light emitting type, therefore compared to a liquid crystal display device, it has excellent visible properties and is broad in an angle of visibility. Accordingly, it may be used as a display portion of various electric devices. In such a case, since the light emitting apparatus of this invention is a passive type light emitting device but may have a large size screen by decreasing the wiring resistance, it may be used in various situations.

As other electronic equipments of the present invention there are: a video camera; a digital camera; a goggle type display (head mounted display); a car navigation system; a car audio stereo; a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a compact disc player (CD), a laser disk player (LD), or a digital versatile disk Player (DVD), and displays the images). Specific examples of those electronic equipments are shown in FIGS. 20A to 21B.

Figure 20A:
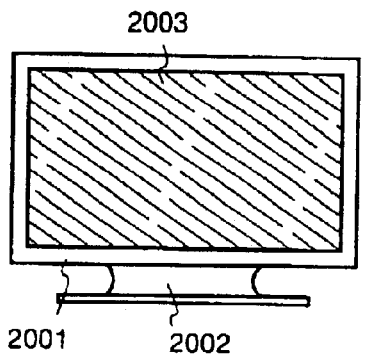
FIGS. 20A to 20F are views showing examples of electric appliances.

FIG. 20A shows an EL display containing a casing 2001, a support stand 2002, and a display portion 2003. The light emitting device of the present invention can be used as the display portion 2003. Such an EL display is a self light emitting type so that a back light is not necessary. Thus, the display portion can be made thinner than that of a liquid crystal display. Note that, if a stick driver is provided in the light emitting device used in the display portion 2003, it is preferable that it is dividedly provided in several tens of parts.

Figure 20B:
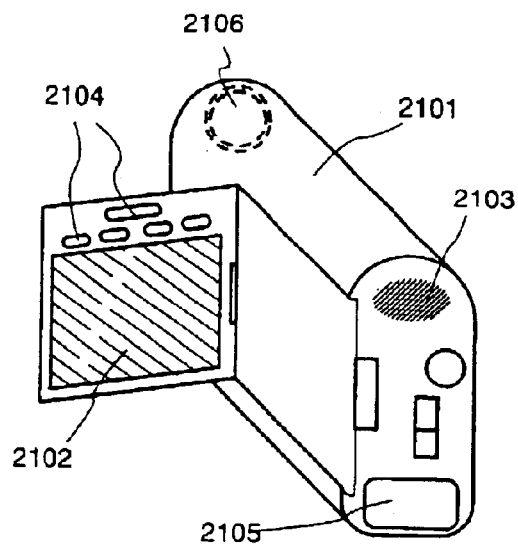

FIG. 20B shows a video camera, and contains a main body 2101, a display portion 2102, a sound input portion 2103, operation switches 2104, a battery 2105, and an image receiving portion 2106. The light emitting device of the present invention can be used as the display portion 2102. Note that, if a stick driver is provided in the light emitting device used in the display portion 2102, it is preferable that it is dividedly provided in several parts.

Figure 20C:
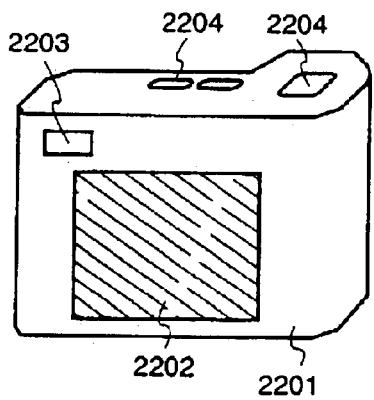

FIG. 20C shows a digital camera, and contains a main body 2201, a display portion 2202, an eye piece portion 2203, and operation switches 2204. The light emitting device of the present invention can be used as the display portion 2202. Note that, if a stick driver is provided in the light emitting device used in the display portion 2202, it is preferable that it is dividedly provided in several parts.

Figure 20D:
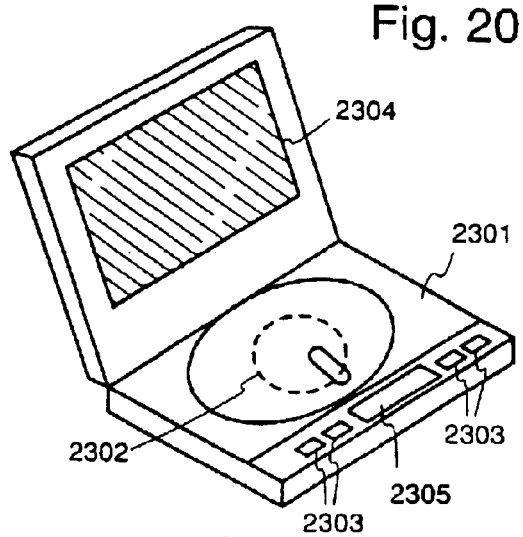

FIG. 20D is an image playback device equipped with a recording medium (specifically, a DVD playback device), and contains a main body 2301, a recording medium (such as a CD, LD or DVD) 2302, operation switches 2303, a display portion (a) 2304, and a display portion (b) 2305. The display portion (a) 2304 is mainly used for displaying image information. The display portion (b) 2305 is mainly used for displaying character information. The light emitting device of the present invention can be used as the display portion (a) 2304 and as the display portion (b) 2305. Note that the image playback device equipped with the recording medium includes devices such as CD playback devices and game machines. Note that, if a stick driver is provided in the light emitting device used in the display portion (b) 2305, it is preferable that it is dividedly provided into several tens of parts.

Figure 20E:
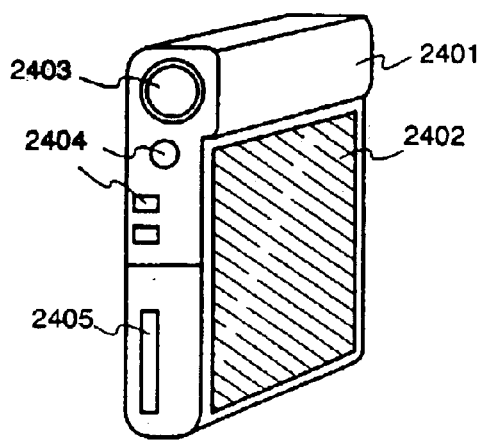

FIG. 20E shows a portable (mobile) computer, and contains a main body 2401, a camera portion 2402, an image receiving portion 2403, operation switches 2404, and a memory slot 2405. The electro-optical device of the present invention can be used as the display portion 2402. This portable computer can record or play back information in the recording medium which is an accumulation of flash memory or involatile memory. Note that, if a stick driver is provided in the light emitting device used in the display portion 2402, it is preferable that it is dividedly provided in several tens of parts.

Figure 20F:
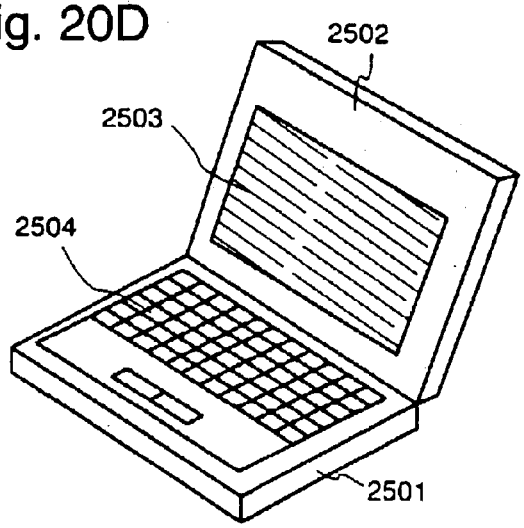

FIG. 20F is a personal computer, and contains a main body 2501, a casing 2502, a display portion 2503, and a keyboard 2504. The light emitting device of the present invention can be used as the display portion 2503. Note that, if a stick driver is provided in the light emitting device used in the display portion 2503, it is preferable that it is dividedly provided in several tens of parts.

Note that if the luminance increases in the future, then it will become possible to use the light emitting device of the present invention in a front type or a rear type projector by expanding and projecting light containing output image information with a lens or the like.

Further, the above electric devices display often information transmitted through an electronic communication circuit such as the Internet and CATV (cable TV), and particularly situations of displaying moving images is increasing. The response speed of EL materials is so high that the above electric devices are good for display of moving image.

In addition, since the light emitting device conserves power in the light emitting portion, it is preferable to display information so as to make the light emitting portion as small as possible. Consequently, when using the light emitting device in a display portion mainly for character information, such as in a portable information terminal, in particular a portable telephone or a car audio stereo, it is preferable to drive the light emitting device so as to form character information by the light emitting portions while non-light emitting portions are set as background.

Figure 21A:
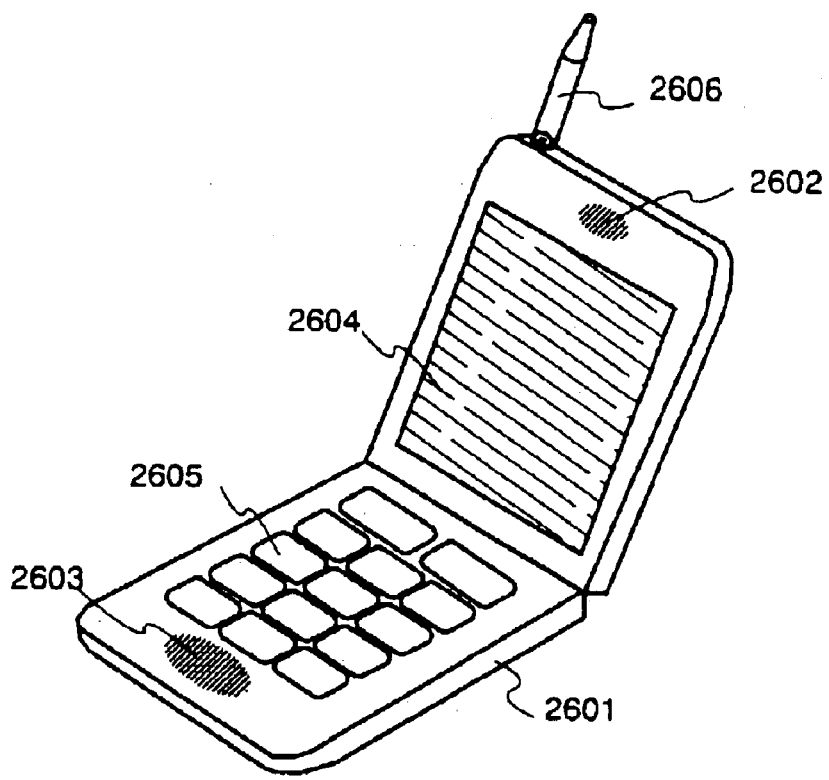
FIGS. 21A and 21B are views showing examples of electric appliances.
Figure 21B:
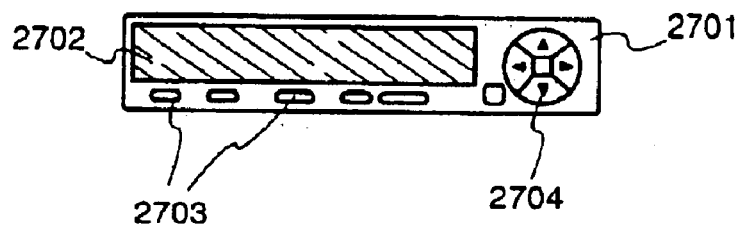

FIG. 21A shows a portable telephone, and contains a main body 2601, a sound output portion 2602, a sound input portion 2603, a display portion 2604, operation switches 2605, and an antenna 2606. The light emitting device of the present invention can be used as the display portion 2604. Note that by displaying white color characters in a black color background, the display portion 2604 can suppress the power consumption of the portable telephone. FIG. 21B shows a car audio stereo, and contains a main body 2701, a display portion 2702, and operation switches 2703 and 2704. The light emitting device of the present invention can be used as the display portion 2702. Further, a car mounting audio stereo is shown in this embodiment, but a fixed type audio playback device may also be used. Note that, by displaying white color characters in a black color background, the display portion 2704 can suppress the power consumption. Note that, if a stick driver is provided in the light emitting device used in the display portion 2704, it is preferable that it is dividedly provided in several parts.

As described above, the application range of this invention is extremely wide, and it may be used for electric devices in various fields. Further, the electric device of this embodiment may be obtained by using a light emitting device freely combining the structures of the first to tenth embodiments.

By implementing the present invention, it is possible to accurately control the film deposition position in depositing the EL material. Therefore, the light emitting device having a highly definite pixel portion can be manufactured. Further, because film deposition of the EL material to the necessary portion can be given priority, the utilization efficiency of the EL material is enhanced and the manufacturing cost can be reduced. In addition, electric equipment having a highly fine display portion can be attained by employing the light emitting device of the present invention as its display portion.

What is claimed is:

1. A method of manufacturing a display device comprising:
   providing a substrate to be processed;
   discharging a material which is charged with a polarity from a head by an ink jet method; and
   applying the material over a surface of the substrate.

2. A method according to claim 1, wherein the material comprises a luminous material.

3. A method according to claim 1, wherein the ink jet method is performed in an inert gas atmosphere.

4. A method according to claim 1, wherein the surface comprises a pixel electrode.

5. A method according to claim 1, wherein the display device is an EL display device.

6. A method according to claim 1, wherein the display device is incorporated in at least one selected from the group consisting of a video camera, a digital camera, an image playback device, a mobile computer, a personal computer, a portable telephone, and a car audio stereo.

7. A method of manufacturing a display device comprising:
   providing a substrate to be processed;
   discharging a material which is charged with a polarity from a head by an ink jet method; and
   applying the material over a surface of the substrate, wherein the surface is charged with an opposite polarity to the polarity.

8. A method according to claim 7, wherein the material comprises a luminous material.

9. A method according to claim 7, wherein the ink jet method is performed in an inert gas atmosphere.

10. A method according to claim 7, wherein the surface comprises a pixel electrode.

11. A method according to claim 7, wherein the display device is an EL display device.

12. A method according to claims 7, wherein the display device is incorporated in at least one selected from the group consisting of a video camera, a digital camera, an image playback device, a mobile computer, a personal computer, a portable telephone, and a car audio stereo.

13. A method of manufacturing a display device comprising:
   providing a substrate to be processed;
   discharging a material which is charged with a polarity from a head by an ink jet method; and
   applying the material over a surface of the substrate, wherein the surface comprises a bank charged with a same polarity as the polarity.

14. A method according to claim 13, wherein the material comprises a luminous material.

15. A method according to claim 13, wherein the ink jet method is performed in an inert gas atmosphere.

16. A method according to claim 13, wherein the surface comprises a pixel electrode.

17. A method to claim 13, wherein the display device is an EL display device.

18. A method according to claim 13, wherein the display device is incorporated in at least one selected from the group consisting of a video camera, a digital camera, an image playback device, a mobile computer, a personal computer, a portable telephone, and a car audio stereo.

19. A method of manufacturing a display device comprising:
   providing a substrate to be processed;
   discharging a material from a head by an ink jet method;
   charging the material with a polarity by an electrode; and
   applying the material over a surface of the substrate.

20. A method according to claim 19, wherein the material comprises a luminous material.

21. A method according to claim 19, wherein the ink jet method is performed in an inert gas atmosphere.

22. A method according to claim 19, wherein the surface comprises a pixel electrode.

23. A method according to claim 19, wherein the electrode comprises at least one selected from the group consisting of an extraction electrode, an accelerating electrode, and a controlling electrode.

24. A method according to claim 19, wherein the display device is an EL display device.

25. A method according to claim 19, wherein the display device is incorporated in at least one selected from the group consisting of a video camera, a digital camera, an image playback device, a mobile computer, a personal computer, a portable telephone, and a car audio stereo.

26. A method of manufacturing a display device comprising:
   providing a substrate to be processed;
   discharging a material from a head by an ink jet method;
   charging the material with a polarity by an electrode; and
   applying the material over a surface of the substrate, wherein the surface is charged with an opposite polarity to the polarity.

27. A method according to claim 26, wherein the material comprises a luminous material.

28. A method according to claim 26, wherein the ink jet method is performed in an inert gas atmosphere.

29. A method according to claim 26, wherein the surface comprises a pixel electrode.

30. A method according to claim 26, wherein the electrode comprises at least one selected from the group consisting of an extraction electrode, an accelerating electrode, and a controlling electrode.

31. A method according to claim 26, wherein the display device is an EL display device.

32. A method according to claim 26, wherein the display device is incorporated in at least one selected from the group consisting of a video camera, a digital camera, an image playback device, a mobile computer, a personal computer, a portable telephone, and a car audio stereo.

33. A method of manufacturing a display device comprising:
   providing a substrate to be processed;
   discharging a material from a head by an ink jet method;
   charging the material with a polarity by an electrode; and
   applying the material over a surface of the substrate, wherein the surface comprises a bank charged with a same polarity as the polarity.

34. A method according to claim 33, wherein the material comprises a luminous material.

35. A method according to claim 33, wherein the ink jet method is performed in an inert gas atmosphere.

36. A method according to claim 33, wherein the surface comprises a pixel electrode.

37. A method according to claim 33, wherein the electrode comprises at least one selected from the group consisting of an extraction electrode, an accelerating electrode, and a controlling electrode.

38. A method according to claim 33, wherein the display device is an EL display device.

39. A method according to claim 33, wherein the display device is incorporated in at least one selected from the group consisting of a video camera, a digital camera, an image playback device, a mobile computer, a personal computer, a portable telephone, and a car audio stereo.

* * * * *